(12) United States Patent
Shinde

(10) Patent No.: US 6,192,386 B1
(45) Date of Patent: Feb. 20, 2001

(54) DIGITAL FILTER, DIGITAL SIGNAL PROCESSING METHOD, AND COMMUNICATION APPARATUS

(75) Inventor: Hiroki Shinde, Kawasaki (JP)

(73) Assignee: Matsushita Electric Industrial Co., Ltd., Osaka (JP)

(*) Notice: Under 35 U.S.C. 154(b), the term of this patent shall be extended for 0 days.

(21) Appl. No.: 09/212,586

(22) Filed: Dec. 16, 1998

(30) Foreign Application Priority Data

Dec. 20, 1997 (JP) .................................... 9-365287
Dec. 4, 1998 (JP) .................................. 10-345766

(51) Int. Cl.⁷ .............................. G06F 17/17; G06F 17/10
(52) U.S. Cl. ....................... 708/313; 708/316; 708/319
(58) Field of Search ............................. 708/313, 316, 708/319, 300; 341/61

(56) References Cited

U.S. PATENT DOCUMENTS

| | | | |
|---|---|---|---|
| 5,335,194 | * 8/1994 | Clayton et al. | 708/313 |
| 5,528,527 | * 6/1996 | Iwata et al. | 708/313 |
| 5,621,404 | * 4/1997 | Heiss et al. | 708/313 |
| 6,134,569 | * 10/2000 | Kot | 708/313 |

FOREIGN PATENT DOCUMENTS

| | | |
|---|---|---|
| 55109024 | 8/1980 | (JP) . |
| 61107808 | 5/1986 | (JP) . |
| 8-84048 | 3/1996 | (JP) . |
| 8162906 | 6/1996 | (JP) . |

OTHER PUBLICATIONS

An English language abstract of JP 55–109024.
An English Language abstract of JP 61–107808.
An English language abstract of JP 8–162906.
An English Language abstract of JP 8–84048.

* cited by examiner

Primary Examiner—Tan V. Mai
(74) Attorney, Agent, or Firm—Greenblum & Bernstein, P.L.C.

(57) ABSTRACT

A digital filter according to the invention is an x-time interpolation (x is an interpolation ratio) type FIR filter. The digital filter is provided with a plurality of stages of delay elements into which serial data are inputted, and a plurality of data distributors which distribute the respective output data of the plurality of stages of delay elements into x different signal channels by a time-sharing system. The respective data distributors operate a rate higher by x times than the input rate of serial data and distribute data into x different channels by time-sharing. Preferably, by utilizing the symmetry of a digital filter coefficients, only the digital filter coefficients corresponding to the half taps at one side of the digital filter are prepared, wherein the respective output data of a pair of delay elements located at the symmetrical positions are inputted into one data distributor, and the respective data are distributed by a time-sharing system.

26 Claims, 25 Drawing Sheets

| h1=h32 | h9=h24 |
|---|---|
| h2=h31 | h10=h23 |
| h3=h30 | h11=h22 |
| h4=h29 | h12=h21 |
| h5=h28 | h13=h20 |
| h6=h27 | h14=h19 |
| h7=h26 | h15=h18 |
| h8=h25 | h16=h17 |

|  | OUT1 | OUT2 | OUT3 | OUT4 |
|---|---|---|---|---|
| STATE 1 | D0*h1 | 0 | 0 | D−7*h4 |
| STATE 2 | 0 | D0*h2 | D−7*h3 | 0 |
| STATE 3 | 0 | D−7*h2 | D0*h3 | 0 |
| STATE 4 | D−7*h1 | 0 | 0 | D0*h4 |

|  | OUT1 | OUT2 | OUT3 | OUT4 |
|---|---|---|---|---|
| STATE 1+STATE 3 | I0*h1 | Q−8*h2 | Q−1*h3 | I−7*h4 |
| STATE 2+STATE 4 | Q−8*h1 | I0*h2 | I−7*h3 | Q−1*h4 |
| STATE 3+STATE 1 | Q0*h1 | I−7*h2 | I0*h3 | Q−7*h4 |
| STATE 4+STATE 2 | I−7*h1 | Q0*h2 | Q−7*h3 | I0*h4 |

DIGITAL FILTER, DIGITAL SIGNAL PROCESSING METHOD, AND COMMUNICATION APPARATUS

BACKGROUND OF THE INVENTION

1. Field of the Invention

The present invention relates to a digital filter, digital signal processing method, and communication apparatus.

2. Description of the Related Art

In a case where m bit data are made into m x bit data by an x-time interpolation circuit, and a digital signal process is carried out with the m*x bit data inputted into a digital filter, the number of delay elements (stages of a shift register) which constitutes a digital filter is increased in proportion to the interpolation ration x. Furthermore, the operating frequency of the digital filter is multiplied x times. Accordingly, the consumption power of the digital filter is increased, and if the digital filter is placed on integrated circuits, the area of occupation thereof is also increased.

Furthermore, in a case where serial data of a plurality of series are digitally signal-processed in parallel to each other in each of the series, it is necessary to prepare a plurality of digital filters, thereby resulting in a further increase in the consumption power and in the area of occupation on the integrated circuit chips.

SUMMARY OF THE INVENTION

Therefore, it is one of the objects of the invention to provide a compact digital filter which has a feature of processing by interpolating digital signals x times (wherein x is a natural figure of 4 or more) and the consumption of which is suppressed to be low.

A digital filter according to the invention includes a plurality of stages of delay elements into which serial data are inputted, and a plurality of data distributors which distribute the respective output data of the plurality of stages of delay elements into x different signal channels by a time-sharing system, wherein the respective data distributors operate x times the input rate of the serial data.

Since the data distributors distribute data at a high rate, the number of data processed by the digital filter becomes x times, and the data are interpolated. On the other hand, the number of delay elements becomes one-xth times the conventional number, and the operating frequency of a plurality of stages of delay elements also becomes one-xth times.

One of the preferred modes of a digital filter according to the invention includes a multiplier which multiplies the output data of the respective data distributors by the coefficient of the digital filter, and x groups of adders.

Furthermore, another preferred mode of the digital filter according to the invention is made into a zero inserted type interpolation filter.

Furthermore, still another preferred mode of the digital filter according to the invention prepares only the multiplying coefficients equivalent to half at one side in digital filter coefficients, utilizing the symmetry of even-ordered and even-symmetrical digital filter coefficients, inputs the respective output data of a pair of delay elements in the symmetrical position into one of the data distributors, and distributes the respective data by a time-sharing system. Thereby, it is possible to further decrease the number of digital filter coefficients, multipliers, and adders by one half.

Furthermore, another preferred mode of the digital filter according to the invention reverses the direction of distributement of the respective data when distributing the respective output data of a pair of delay elements in the symmetrical position by a time-sharing system Furthermore, another preferred mode of the digital filter according to the invention multiplexes two series of serial data and converts them into one series of serial data, wherein the serial data are inputted into a plurality of stages of delay elements having a folded structure, the respective outputs of a pair of delay elements in the symmetrical position are distributed by time-sharing via a selector, the two series of data are processed in parallel so that the independency of the respective series are not spoiled, and are finally separated into data of the respective series.

Thereby, the number of a plurality of stages of delay elements becomes 1-xth times the conventional number, the operating frequency is lowered to two-xth times, and the number of digital filter coefficients, multipliers and adders also become one-xth times the conventional number.

Furthermore, in another preferred mode of the digital filter according to the invention, the construction of a selector is devised, and data orthogonal to each other are used as two series of data to be multiplexed. The data orthogonal to each other are, for example, I signal data and Q signal data which are used in digital radio transmission.

Furthermore, in another preferred mode of the digital filter according to the invention, one of the two series of data separated and outputted from the digital filter is provided with a phase adjusting circuit for adjusting the phase.

Furthermore, another preferred mode of the digital filter according to the invention is provided with a selector which selects and outputs either data passed through the phase adjusting circuit or data not passed therethrough. By controlling the selector, it is possible to selectively output QPSK (Quadrature Phase Shift Keying) modulated signals and OQPSK (Offset Quadrature Phase Shift Keying) modulated signals.

Furthermore, in another preferred mode of the digital filter according to the invention, two types of digital filter coefficients are prepared, corresponding to the two series of multiplexed data, and the digital filter coefficients are selectively used. It is preferable that two types of digital filter coefficients are adequately rewritten.

Furthermore, in another preferred mode of the digital filter according to the invention, the frequency of a clock used in the digital filter is made variable. In this case, a timing adjusting circuit may be provided, which is able to adjust the output timing of two series of data outputted from the digital filter.

With the invention, a novel and small-sized digital filter can be achieved, which allows for suppression of power consumption, and a processing feature for interpolating digital signals x times, wherein x is a natural figure of 4 or more.

Furthermore, a communication apparatus according to the invention is a communication apparatus provided with the abovementioned x-time interpolation digital filter. The digital filter can be used to limit the band of transmission signals before digital-analog conversion.

Furthermore, in one of the preferred modes of the communication apparatus according to the invention, the multiplying coefficients in the digital filter can be kl renewed in real time, the gain of the filter is adequately adjusted, and the gain difference of the two series of transmission signals can be reduced.

Furthermore, in another preferred mode of the communication apparatus according to the invention, the conformity with other circuits can be increased by adequately selecting the operating frequency of the digital filter.

With the invention, a high-performance, high-speed, novel, and small-sized communication apparatus can be achieved, which is used for digital mobile transmission at suppressed power consumption.

BRIEF DESCRIPTION OF THE DRAWINGS

FIG. 18 is a view showing the transition of output data of the data distributor;

DESCRIPTION OF THE PREFERRED EMBODIMENTS

Hereinafter, a description is given of the embodiments of the invention with reference to the accompanying drawings.

First Embodiment

Figure 4:
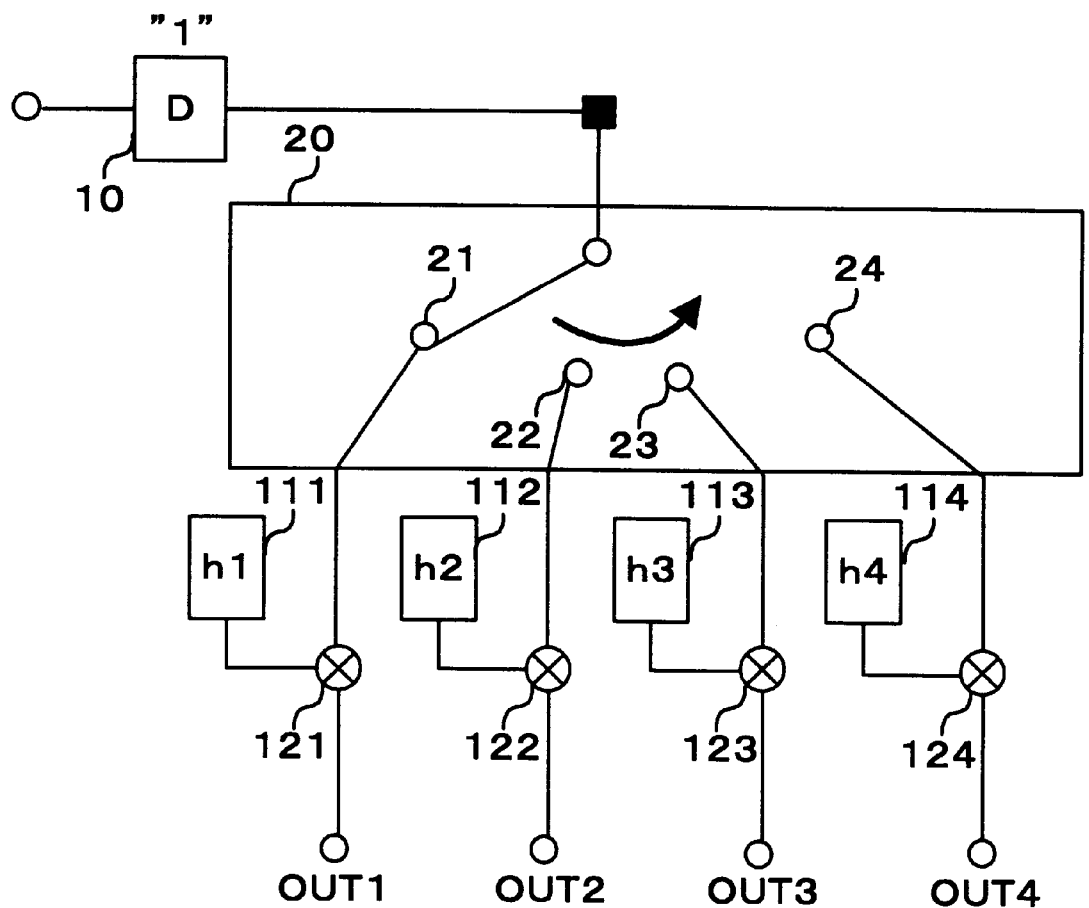
FIG. 4 is a view explaining actions of a data distributor used in a digital filter according to the invention.
Figure 5:
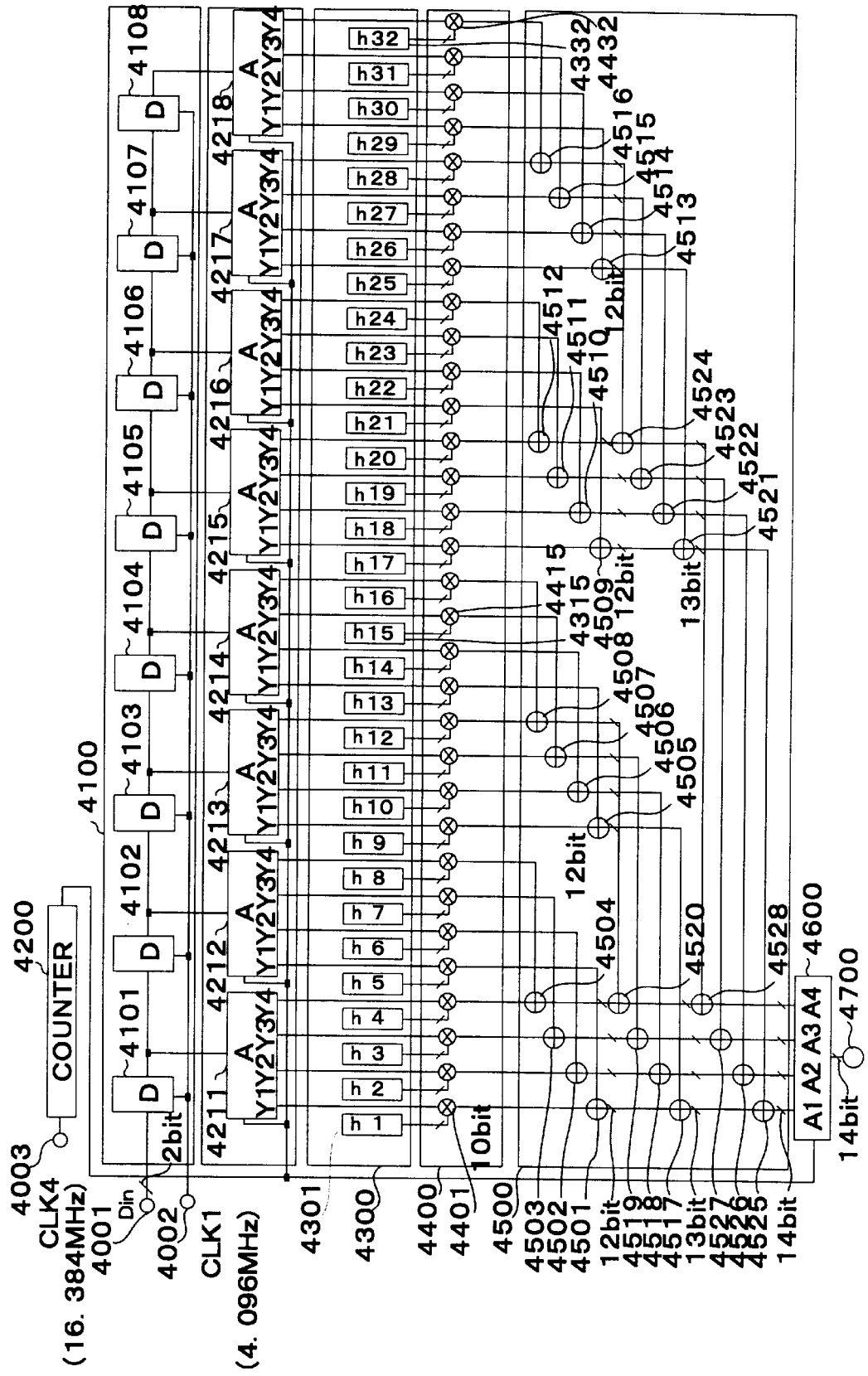
FIG. 5 is a block diagram of a digital filter which is a first embodiment of the invention.

The entire configuration of a digital filter according to the embodiment is illustrated in FIG. 5. Before explaining the entire configuration of the digital filter, a description is given of the features of the digital filter illustrated in FIG. 5, with reference to FIG. 1 through FIG. 4.

The digital filter according to the embodiment is a FIR (Finite Impulse Response) type digital filter (4-time zero-interpolation filter) in which an interpolation ratio x having a feature for interpolating data of zero level is 4.

Figure 1A:
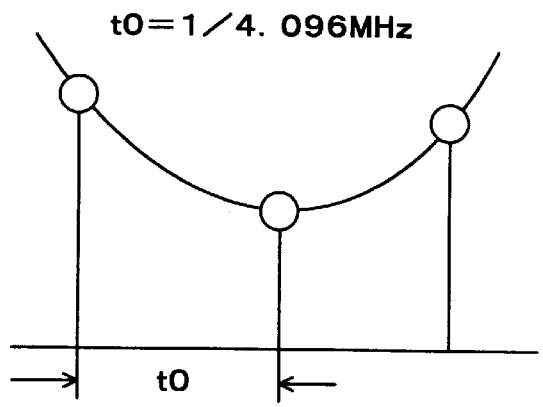
FIG. 1A is a waveform diagram of a digital input signal.
Figure 1B:
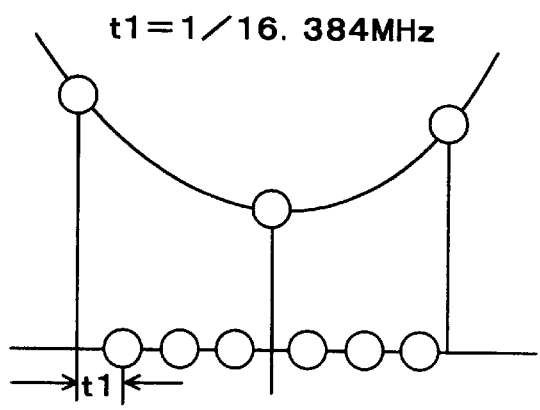
FIG. 1B is a waveform diagram of a digital signal after being 4-time zero-interpolated.
Figure 1C:
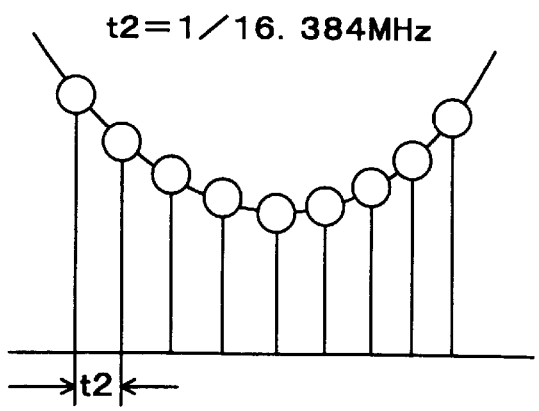
FIG. 1C is a waveform diagram of a digital filter.

The 4-time zero-interpolation filter uses, as an input, a digital signal having, for example, such an impulse component as shown in FIG. 1A, carries out a 4-time zero-inserted interpolation process and obtains a 4-time interpolated signal as shown in FIG. 1B, wherein by carrying out multiplication and addition of the 4-time interpolated signal, a digital filter output signal as shown in FIG. 1C is obtained.

Figure 2A:
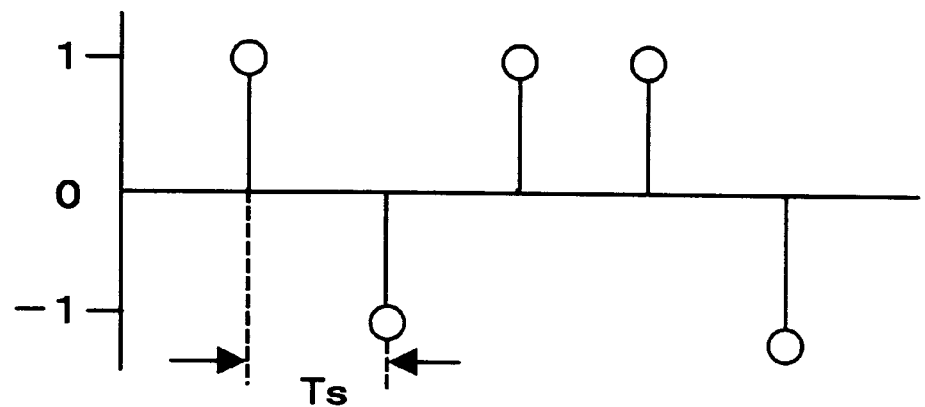
FIG. 2A is a view showing one example of a digital signal inputted in synchronization with a clock.

In this embodiment, as shown in FIG. 2A, 1 or −1 symbol data is inputted in synchronization with a symbol clock. The input cycle of the symbol data is Ts. Furthermore, in the following description, 1/Ts is called symbol rate.

Figure 2B:
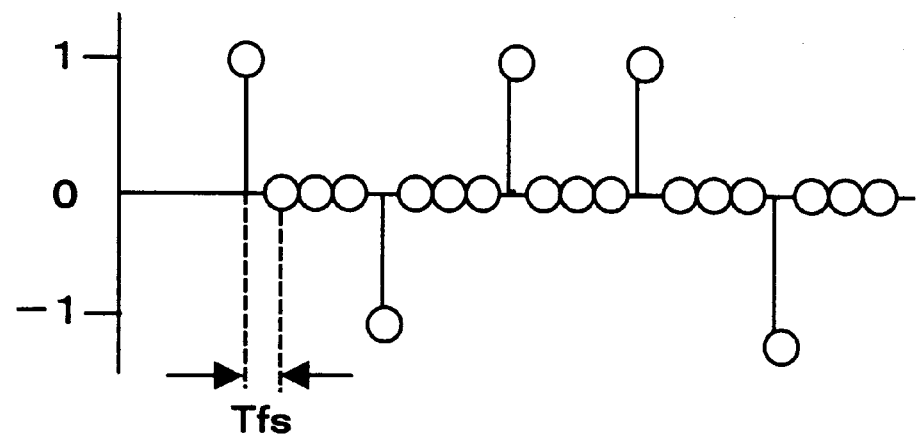
FIG. 2B is a view showing a digital signal after being 4-time zero-interpolated.

Next, as shown in FIG. 2B, three pieces of data of zero level are inserted between the symbol data, whereby the number of data are increased four times, and the data transfer cycle Tfs of a shift register in the digital filter becomes four times the input cycle Ts of the symbol data. In the following description, 1/Tfs is called transfer rate of the shift register.

Figure 3:
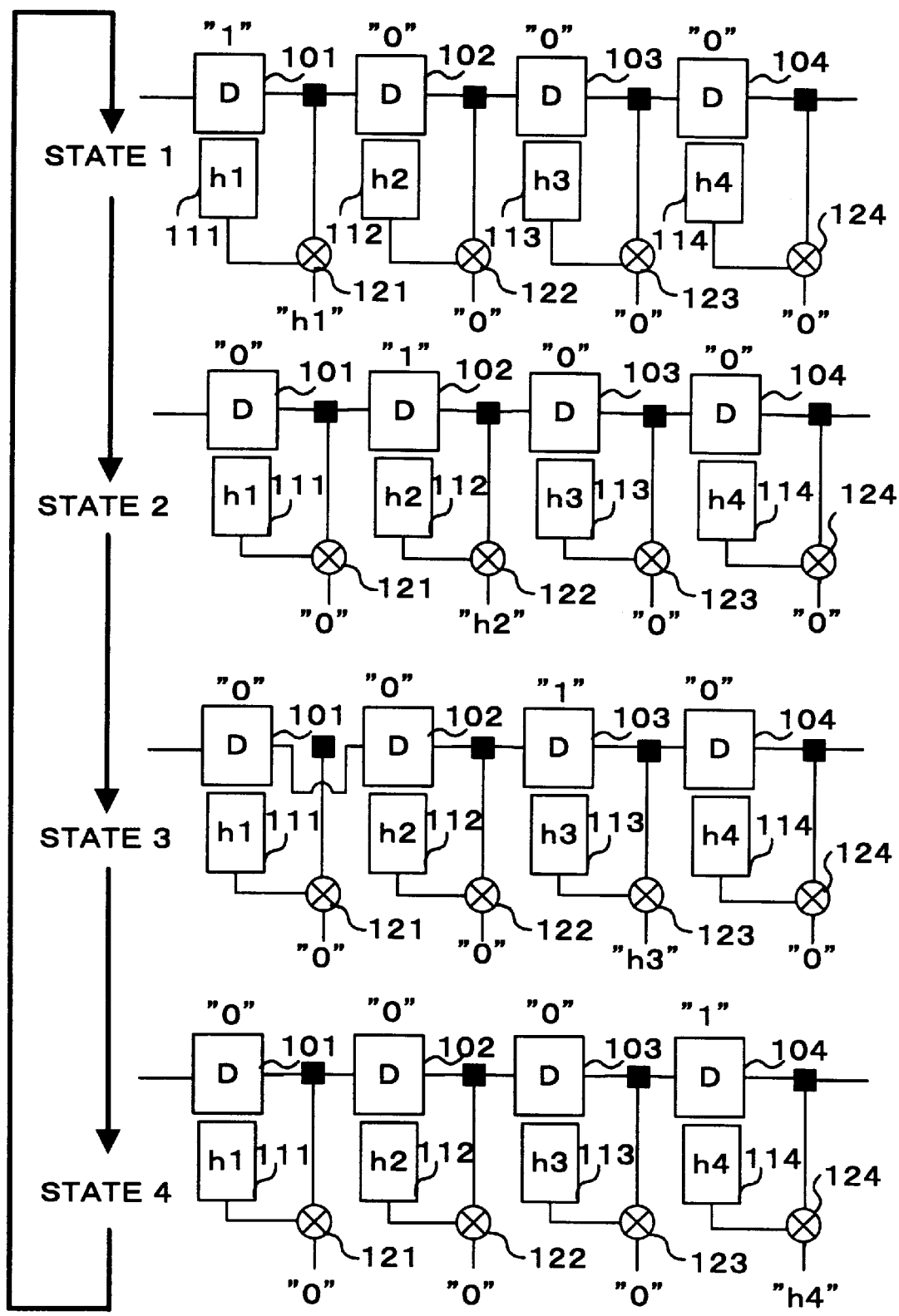
FIG. 3 is a view explaining the operating principle of a digital filter according to the invention.

Herein, a case where serial data of 0, 0, 0, and +1 are inputted into the shift register is taken into consideration. FIG. 3 shows the condition in which these inputted serial data are transferred in the shift register.

In FIG. 3, reference numerals 101 through 104 indicate a memory element (delay element) of each stage of the shift register (delay unit), reference numerals 111 through 114 indicate a memory circuit of the digital filter coefficients, reference numerals 121 through 124 indicate a multiplier, and h1 through h4 show a digital filter coefficient (multiplication coefficient).

As has been made clear in FIG. 3, data 1 is transferred stage by stage from left to right in the shift register in synchronization with a transfer clock, and h1 through h4 are outputted one after another in line therewith.

Here, either one of h1 through h4 is outputted from one of the four output terminals, and at this time, the outputs of all the other terminals are made zero. Therefore, in the circuit of FIG. 3, it can be considered that such an action is carried out at the shift register, in which data 1 is distributed in order from the left terminal to the right terminal by a time-sharing system, and the other terminals to which no data is distributed are fixed at zero level.

Taking notice of this point, in the embodiment, a feature equivalent to the circuit of FIG. 3 can be achieved by using a data distributor as shown in FIG. 4.

That is, in FIG. 4, data 1 is retained in one memory element 10. In this state, a data distributor (switching circuit) 20 distributes data 1 to terminals 21 through 24 by time-sharing at a speed which is higher by four times than the symbol rate, whereby h1 through h4 are sequentially outputted from the four output terminals OUT1 through OUT4, and a process equivalent to the circuit of FIG. 3 can be achieved.

In the circuit shown in FIG. 4, the number of stages of shift registers becomes one-fourth of that of the circuit shown in FIG. 3, and the circuit is remarkably simplified. In a case where the shift registers are made of integrated circuits since it is constructed so that, for example, a number of D type flip flops are connected in multiple stages, they may occupy a considerable area on a chip. Therefore, by the number of stages of the shift registers becoming one-fourth, the integrated circuits are caused to be downsized.

Since it is not necessary to make the operating frequency of the shift registers quadruple (four times) regardless of four-time interpolation, power consumption can be decreased. That is, in a case where the four-time interpolated data is inputted into the shift registers, the operating frequency of the entire digital filter becomes higher by four times than that of the case where no interpolation is made.

However, in the embodiment, by inputting the data before interpolation into the shift registers and distributing the data at a frequency which is higher by four times than that of the input rate, the four-time interpolation can be substantially achieved inside the digital filter. Therefore, although the operating frequency is increased at only the data distributor, it is enough that the shift registers operate at the same frequency as that in a case where no four-time interpolation is carried out, whereby power consumption can be remarkably decreased.

The features of the digital filter according to the invention are as described above. Hereinafter, a detailed description is given of the configuration and actions of the digital filter according to the embodiment, using FIG. 5.

A digital filter shown in FIG. 5 is provided with a counter 4200, a shift register (delay unit) consisting of D-type flip flops (delay elements) 4101 through 4108, data distributors 4211 through 4218 whose ratio between the number of inputs and that of outputs is 1:4, digital coefficient storing circuits 4301 through 4332 for storing digital filter coefficients h1 through h32, multipliers 4401 through 4432, adders 4501 through 4528, and a data selector 4600.

Symbol data (Din) are inputted from the input terminal 4001 in synchronization with a symbol clock CLK1 (4.096 Mhz). The symbol clock CLK1 is inputted from a clock input terminal 4002.

The counter 4200 cyclically repeats a counting action, from 1 to 4, of the number of inputs of clock CLK4 having a frequency higher by four times than that of the symbol clock CLK1, which is inputted from the terminal 4003, and outputs one clock at each counting action.

The data distributors 4211 through 4218 distributes the data to be inputted into the terminal A to four terminals Y1 through Y4 by time-sharing in synchronization with output of the counter 4200.

In each of the data distributors, in a case where one terminal (for example, Y1) is selected, the output level of the other terminals Y2 through Y4 are fixed to be at zero level. As described above, with this data distributement, a four-time zero interpolation can be substantially achieved.

As has been made clear in FIG. 3 and FIG. 4, when the respective data distributors distribute data by time-sharing, four states exist, corresponding to the positions to which data are distributed.

That is, in the data distributors 4211 through 4218 in FIG. 5, the time when the terminal Y1 is selected as the output destination of data is state 1, the time when the terminal Y2 is selected as the output destination of data is state 2, and similarly the time when the terminal Y3 is selected is state 3, and the time when the terminal Y4 is selected is state 4.

Transmission functions H(z) in the respective states are as described below:

State 1:

$$H(z)=h1+h5z-4+h9z-8+h13z-12+h17z-16+h21z-20+h25z-24+h29z-28 \quad (1)$$

State 2:

$$H(z)=h2z-1+h6z-5+h10z-9+h14z-13+h18z-17+h22z-21+h26z-25+h30z-29 \quad (2)$$

State 3:

$$H(z)=h3z-2+h7z-6+h11z-10+h15z-14+h19z-18+h23z-22+h27z-26+h31z-30 \quad (3)$$

State 4:

$$H(z)=h4z-3+h8z-7+h12z-11+h16z-15+h20z-19+h24z-23+h28z-27+h32z-31 \quad (4)$$

In the above expressions (1) through (4) z-m means the mth delay.

The data outputted from each of the data distributors 4211 through 4218 are multiplied by the corresponding digital filter coefficients h1 through h32 in the multipliers 4400 through 4432 in compliance with the abovementioned expressions (1) through (4). Subsequently, data are added to each output in the abovementioned four states by a group of adders 4501 through 4528.

The data selector 4600 selects, one after another, the respective data, corresponding to the states 1 through 4, inputted into the input terminals A1 through A4 by time-sharing, and outputs it from the output terminal 4700. Thus, four-time interpolated digital filter outputs can be obtained.

Figure 6:
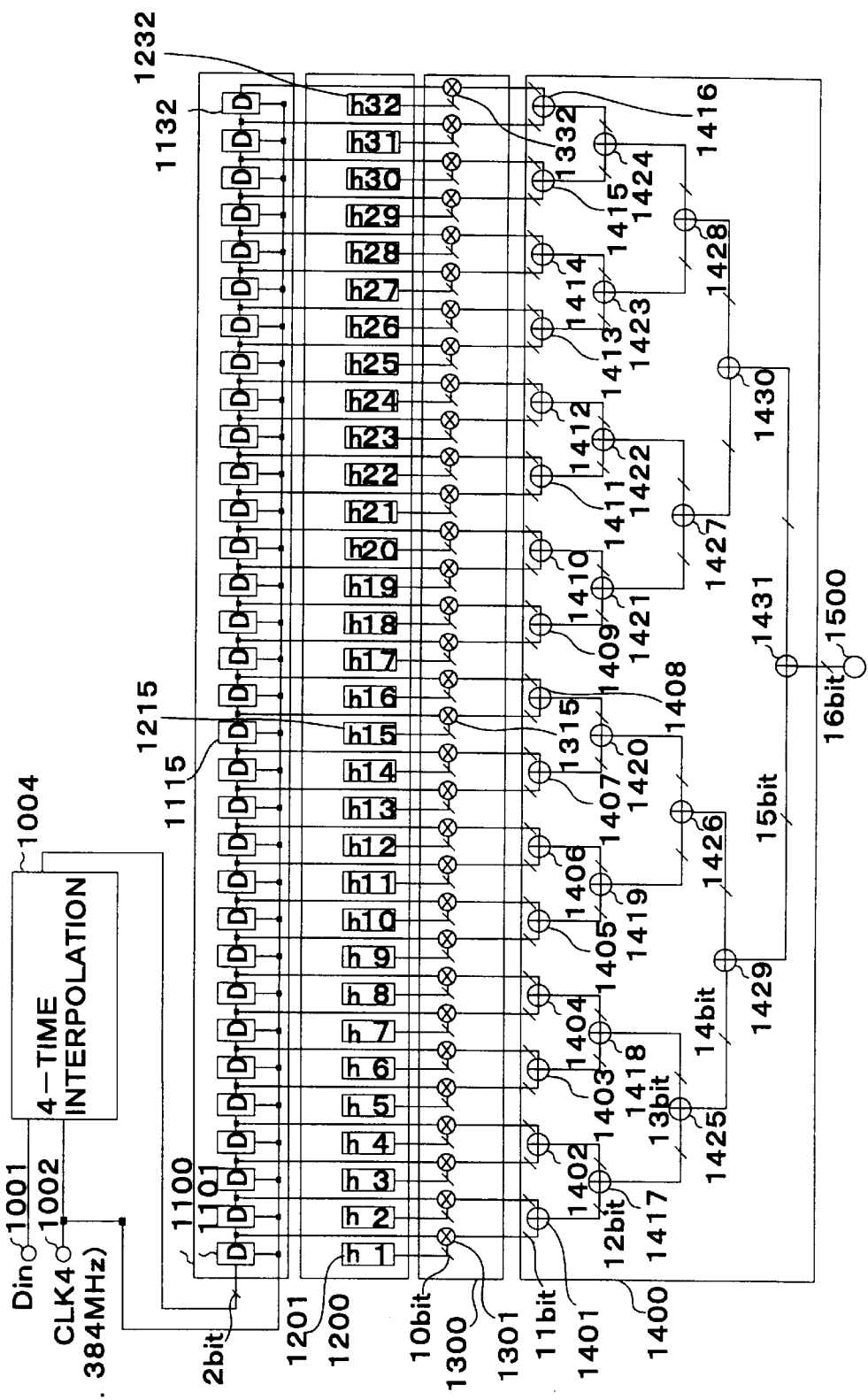
FIG. 6 is a block diagram of a digital filter as a comparison example.

FIG. 6 shows the configuration of a digital filter as a comparison example.

In the digital filter illustrated in FIG. 6, after the symbol data (Din) is interpolated four times in the four-time interpolation circuit 1004, the data is inputted into the digital filter. The four-time interpolation circuit 1004 operates by the clock CLK4 (16.384 Mhz) which is higher by four times than that of the symbol clock (4.096 Mhz).

With such a configuration, the number of stages of shift registers 1100 which constitute the digital filter becomes n*x stages in a case where the number of bits (data width) per symbol is made n and the interpolation ratio is made x (herein x=4), and is increased in proportion to the interpolation ratio x.

Furthermore, since it is necessary that the shift register 4100 operates at a high rate of 16.384 Mhz as in the four-time interpolation circuit 1004, power consumption is great at this part.

To the contrary, in the digital filter according to the embodiment in FIG. 5, the number of stages of shift registers may be of the same stages as the data width of one symbol (that is, n stages). In comparison with the digital filter illustrated in FIG. 6, the number of stages of shift registers is decreased to one-xth. Therefore, in a case where the digital filter is made of integrated circuits, the chip area can be saved, resulting in a downsizing of the integrated circuits and electronic devices in which such integrated circuits are incorporated.

Furthermore, the operating frequency of the shift register may be the same as the frequency of the symbol clock (that is, 4.096 Mhz), wherein even though an x-time interpolation is carried out, power consumption at this part can be prevented from being increased.

Thus, with a digital filter according to the embodiment, it is possible to simplify the configuration, to decrease the chip area when integrated circuits are employed, and to decrease power consumption.

Second Embodiment

Next, a description is given of a second embodiment of the invention.

Figure 10:
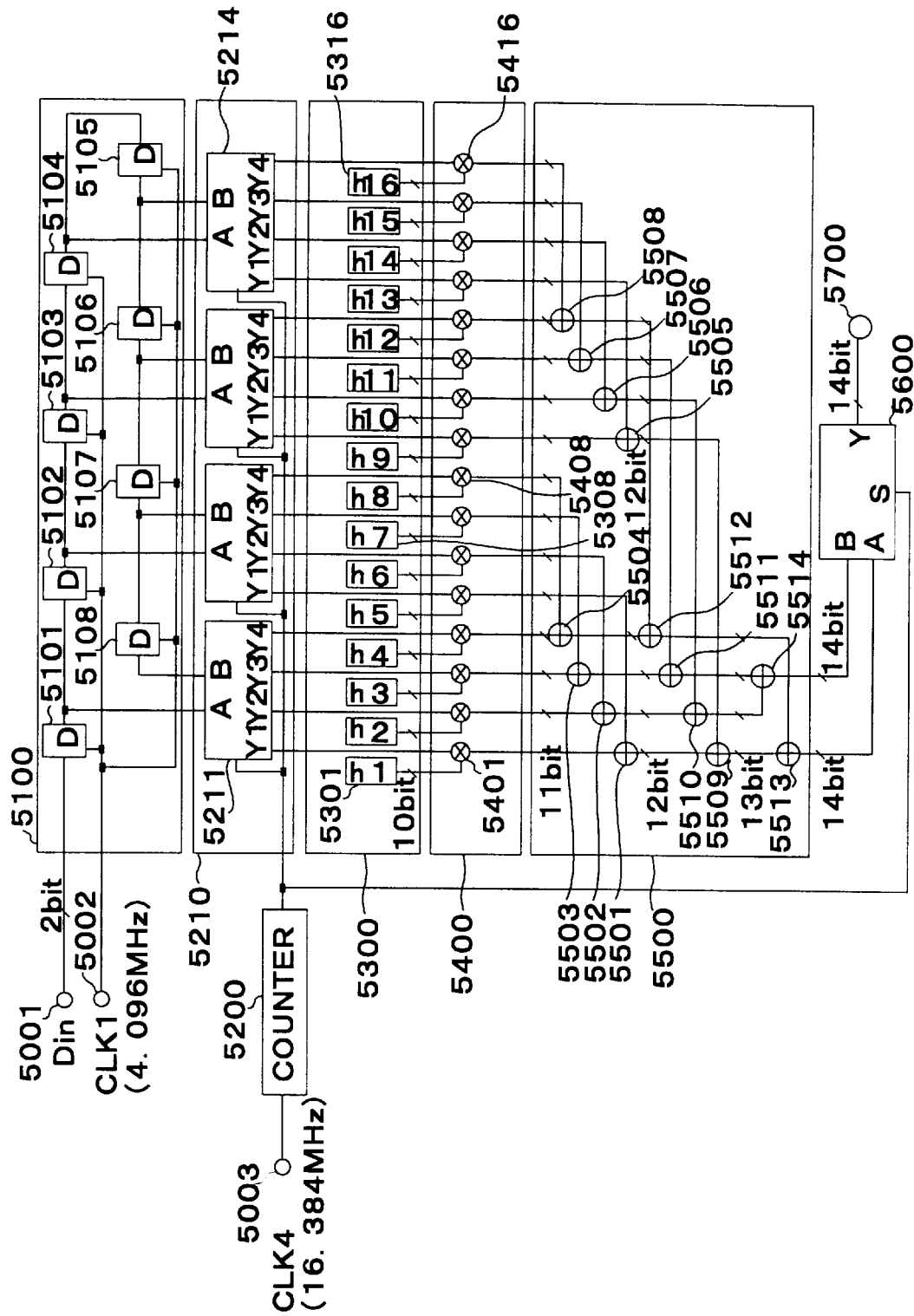
FIG. 10 is a block diagram of the digital filter according to the second embodiment of the invention.

FIG. 10 shows a configuration of four-time zero interpolation FIR type digital filter according to this embodiment.

Figure 8A:
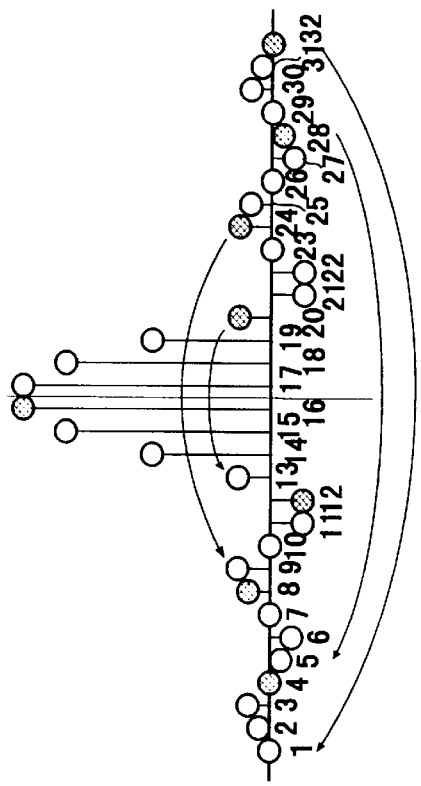
FIG. 8A is a view showing the digital filter coefficients symmetrical to each other when a digital filter according to the first embodiment of the invention is in the first state.
Figure 8C:
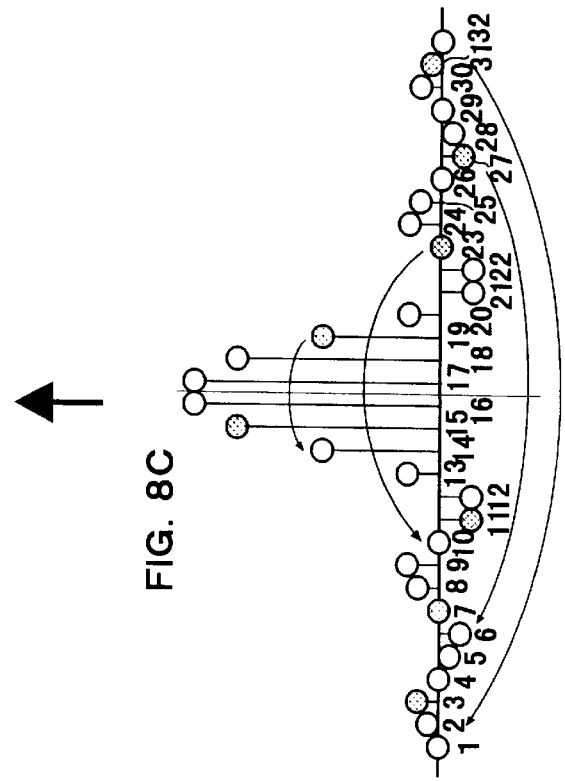
FIG. 8C is a view showing the digital filter coefficients symmetrical to each other when a digital filter according to the first embodiment of the invention is in the third state.
Figure 8B:
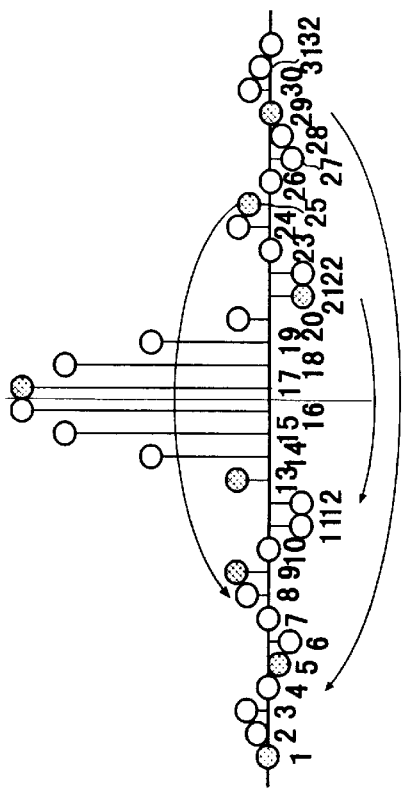
FIG. 8B is a view showing the digital filter coefficients symmetrical to each other when a digital filter according to the first embodiment of the invention is in the second state.
Figure 8D:
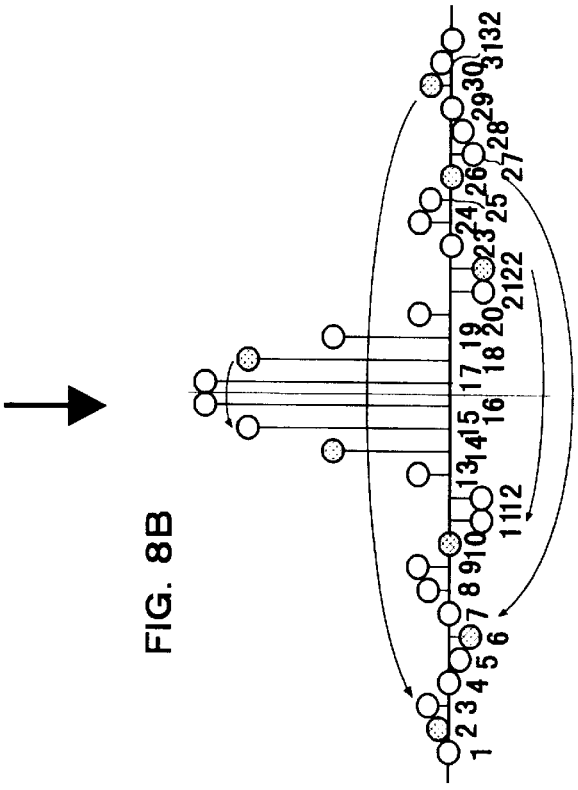
FIG. 8D is a view showing the digital filter coefficients symmetrical to each other when a digital filter according to the first embodiment of the invention is in the fourth state.
Figure 9:
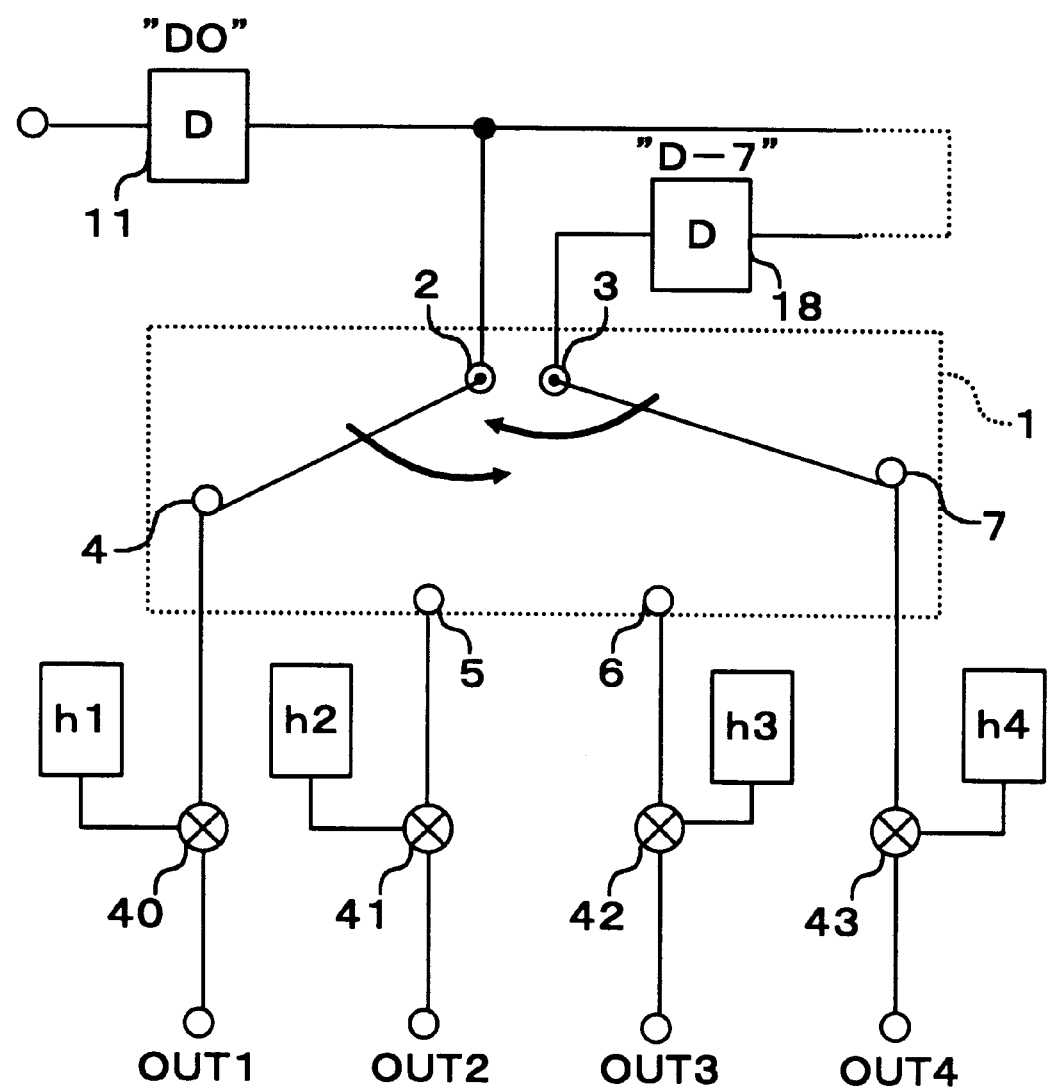
FIG. 9 is a view explaining actions of a data distributor in a digital filter according to a second embodiment of the invention.

Before describing the configuration of this digital filter, a description is given of the features of a digital filter illustrated in FIG. 10, using FIG. 7 through FIG. 9.

The digital filter according to the embodiment is able to achieve an x-time interpolation by data distributement in a time-sharing system as in the abovementioned first embodiment. In addition thereto, by utilizing the respective coefficient values in an even-numbered and even-symmetrical digital filter being symmetrical at both left and right sides, it is attempted that the coefficients are commonly used, for example, by using the left half coefficients as the right half coefficients as well, whereby the number of the digital filter coefficients and number of multipliers and adders are reduced to one-half of those in the abovementioned embodiment.

Hereinafter, a detailed description is given of the features of a filter according to this embodiment.

It is advantageous that the FIR digital filter completely achieves linear phase characteristics. Linear phase characteristics mean a property in that the phase difference between input signals and output signals is proportionate to the frequency of the input signals. Where a filter having the linear phase characteristics does not produce any phase distortion (distortion of output signals resulting from a phase gap). Therefore, as in a case where a band limiting filter is composed of a digital filter, when it is not favorable that a phase distortion occurs, it is necessary to prepare a filter (linear phase filter) having linear phase characteristics.

Herein, the condition in that a FIR filter has linear phase characteristics occurs where the following expression (5) or (6) is satisfied.

$$hm = hM-m \tag{5}$$

$$hm = -hM-m \tag{6}$$

However, in the abovementioned expressions, M is the order of filters (=number of taps), and m=0, 1, . . . , and M.

Expression (5) is established with respect to an even-symmetrical filter, and expression (6) is established with respect to an odd-symmetrical filter.

Figures 7A, 7B:
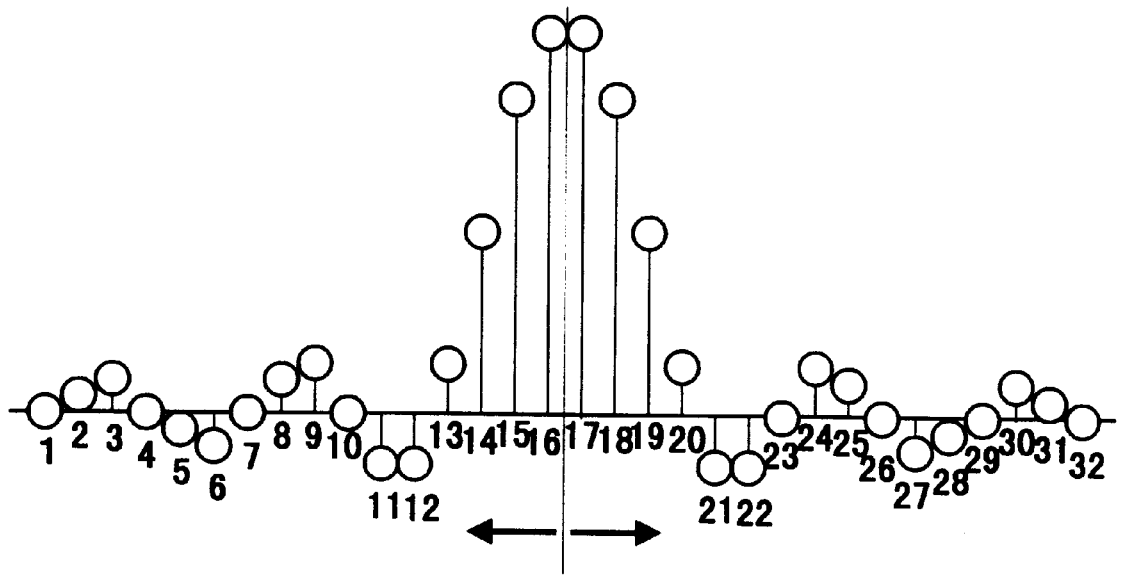
FIG. 7A is a view showing a configuration of an even-numbered and even-symmetrical digital filter coefficients.
FIG. 7B is a view showing a combination of two digital filter coefficients which are symmetrical to each other.

Therefore, a linear phase FIR filter whose order M is an even-number (even order) and coefficient value is left-right symmetrical (even-symmetrical) has an array of digital filter coefficients as shown in FIG. 7A.

The filter illustrated in FIG. 7A is a filter having thirty-two taps (the order of filters=32) having thirty-two digital filter coefficients. Furthermore, in FIG. 7A, the abscissa indicates the tap number, and the ordinate indicates the value of the respective digital coefficients.

As shown in FIG. 7B, when the digital filter coefficients illustrated in FIG. 7A is folded at the center, the value of a pair of filter coefficients located at mutually overlapping positions (that is, in symmetrical positions) are equal to each other. In this embodiment, taking notice of this point, for example, by achieving a 32-tap filter using only the coefficients (sixteen coefficients) at the left half side, the configuration of the filter can be remarkably simplified.

Each of FIG. 8A through FIG. 8D corresponds to each of the first through fourth states of the digital filter as described in the first embodiment, wherein digital filter coefficients used in the respective states and located at mutually symmetrical positions are indicated by the arrow markings.

As described in the abovementioned embodiment, the state of a data distributor whose ratio of the number of inputs to the number of outputs is 1:4, where data is outputted from the extreme left output end, is regarded as state 1.

The filter coefficients used in this state 1 are h1, h4, h9, h13, h17, h21, h25, and h29 as shown by the diagonal lines in FIG. 8A. As shown by the arrow markings in FIG. 8A, h17 can be replaced by h16. As well, h21 can be replaced by h12, h25 can be replaced by h8, and h29 can be replaced by h4.

Therefore, in the state 1, it is possible to perform a multiplication and addition process by using only the coefficients at the left half side, which are h1, h5, h9, h13, h16, h12, h8, and h4.

FIG. 8B shows a symmetrical relationship of digital filter coefficients in the state 2. The filter coefficients used in the state 2 are h2, h6, h10, h14, h18, h22, h26, and h30 as shown by the diagonal lines in FIG. 8B. However, as shown by the arrow markings, h18 can be replaced by h15, as well, h22 can be replaced by h11, h26 can be replaced by h7, and h30 can be replaced by h3.

Therefore, in actuality, a multiplication and addition process can be carried out by using only the coefficients at the left half side, which are h2, h6, h10, h14, h15, h11, h7, and h3.

FIG. 8C shows a symmetrical relationship of digital filter coefficients in the state 3. The filter coefficients used in the state 3 are h3, h7, h11, h15, h19, h23, h27 and h31 as shown by the diagonal lines in FIG. 8C. However, as shown by the arrow markings, h19 can be replaced by h14, as well, h23 can be replaced by h10, h27 can be replaced by h6, and h31 can be replaced by h2.

Therefore, in actuality, it is possible to carry out a multiplication and addition process by using only the coefficients at the left half side, which are h3, h7, h11, h15, h14, h10, h6 and h2.

FIG. 8D shows a symmetrical relationship of digital filter coefficients in the state 4. The filter coefficients used in the state 4 are h4, h8, h12, h16, h20, h24, h28 and h32 as shown by the diagonal lines in FIG. 8D. However, as shown by the arrow markings, h20 can be replaced by h13, as well, h24 can be replaced by h9, h28 can be replaced by h5, and h32 can be replaced by h1.

Therefore, in actuality, it is possible to carry out a multiplication and addition process by using only the coefficients at the left half side, which are h4, h8, h12, h16, h13, h9, h5, and h1.

In a case where a calculation process is carried out by using only the coefficients at the left half side, which are h1 through h16, transmission functions H(Z) in each of the first to fourth states are as follows;

State 1:

$$H(z)=h1+h5z\text{-}4+h9z\text{-}8+h13z\text{-}12+h16z\text{-}16+h12z\text{-}20+h8z\text{-}24+h4z\text{-}28) \quad (7)$$

State 2:

$$H(z)=h2z\text{-}1+h6z\text{-}5+h10z\text{-}9+h14z\text{-}13+h15z\text{-}17+h11z\text{-}21+h7z\text{-}25+h3z\text{-}29 \quad (8)$$

State 3:

$$H(z)=h3z\text{-}2+h7z\text{-}6+h11z\text{-}10+h15z\text{-}14+h14z\text{-}18+h10z\text{-}22+h6z\text{-}26+h2z\text{-}30 \quad (9)$$

State 4:

$$H(z)=h4z\text{-}3+h8z\text{-}7+h12z\text{-}11+h16z\text{-}15+h13z\text{-}19+h9z\text{-}23+h5z\text{-}27+h1z\text{-}31 \quad (10)$$

FIG. 9 shows a part of a circuit configuration to execute a multiplication and addition process shown by the expressions (7) through (10) in the respective states. The circuit illustrated in FIG. 9 shows a circuit which carries out a multiplication and addition process using the coefficients of each of the first, second, third and fourth taps, and of each of the twenty-ninth, thirtieth, thirty-first, and thirty-second taps among the digital filter coefficients of thirty-two taps (the tap coefficients) shown in FIG. 8A through FIG. 8D.

The circuit illustrated in FIG. 9 is provided with an 8-bit shift register (consisting of delay elements 11 through 18) having a construction such that it is folded at the center, a data distributor 1 whose ratio of the number of inputs to outputs is 2:4, operating at a rate which is higher by four times than that of the transfer rate of the symbol data inputted into the shift register, multipliers 40 through 43, and digital filter coefficients (tap coefficients) h1 through h4.

The data distributor 1 distributes data inputted into the input terminal 2 from the direction of the output terminal 4 to the output terminal 7 one after another by time-sharing, and, in parallel thereto, distributes data inputted into the input terminal 3 from the direction of the output terminal 7 to the output terminal 4 one after another.

That is, in this embodiment using only the coefficient at the left half side among thirty-two digital filter coefficients, as shown in FIG. 8A, in the state 1, the input data (first data) is multiplied by a coefficient h1 corresponding to the first tap while the input data (the twenty-ninth data) is multiplied by a coefficient h4 corresponding to the twenty-ninth tap.

In the circuit illustrated in FIG. 9, the input data corresponding to the first through fourth taps is D0 stored in the D type flip flop 11, and the input data corresponding to the twenty-ninth through thirty-second taps is D-7 stored in the D type flip flop 18.

Therefore, in the state 1, the multiplier 40 multiplies D0 by a coefficient h1, and the multiplier 43 multiplies D-7 by a coefficient h4. The results (products) of the multiplication are outputted in parallel to each other from the output terminals OUT1 and OUT4. Subsequently, by adding the respective output data to each other, a process is achieved in compliance with the transmission function of the abovementioned expression (7).

In the state 2, as shown in FIG. 8B, the second piece of data is multiplied by a coefficient h2, and the thirtieth piece of data is multiplied by a coefficient h3. In the circuit illustrated in FIG. 9, by switching the contacts of a switch, in the state 2, D0 and D-7 are outputted from the output terminals 5 and 6 of the data distributor 1 and each of them is, respectively, multiplied by a coefficient h2 and a coefficient h3, wherein by adding the product data to each other, a process shown by the transmission function of the abovementioned expression (8) is carried out.

In the state 3, as shown in FIG. 8C, the third piece of data is multiplied by a coefficient h3, and the thirty-first piece of data is multiplied by a coefficient h2.

In the circuit illustrated in FIG. 9, in the state 3, d0 and D-7 are outputted from the output terminals 6 and 5 of the data distributor 1, and each of them is, respectively, multiplied by a coefficient h3 and a coefficient h2. Therefore, by adding the product data to each other, a process shown by the transmission function of the abovementioned expression (9) is carried out.

As shown in FIG. 8D, in the state 4, the fourth piece of data is multiplied by a coefficient h4, and the thirty-second piece of data is multiplied by a coefficient h1.

In the circuit illustrated in FIG. 9, in the state 4, d0 and D-7 are outputted from the output terminals 7 and 4 of the data distributor 1, wherein each of them is, respectively, multiplied by a coefficient h4 and a coefficient h1. Therefore, by adding the product data to each other, a process shown by the transmission function of the abovementioned expression (9) is carried out.

Thus, in the embodiment, the shift register is folded in half, and each of the output of a pair of D type flip flops located at the symmetrical positions is inputted into one data distributor, wherein by distributing each of the input signals in the reverse direction by time-sharing, the number of the digital filter coefficients is made into half. Since the number of the coefficients is reduced by half, the number of multipliers and adders are also reduced by half, thereby causing the circuitry to be remarkably simplified.

The abovementioned are the features of a digital filter according to the second embodiment.

Hereinafter, a detailed description is given of a mechanism and actions of a digital filter according to the second embodiment.

A digital filter in FIG. 10 is a filter equipped with thirty-two taps, which is provided with a counter 5200, a shift register (delay unit) 5100 consisting of D type flip flops (delay elements) 5101 through 5108, data distributors 5211 through 5214 whose ratio of the number of the inputs to outputs is 2:4, digital filter coefficient storing circuits 5301 through 5316 in which digital filter coefficients h1 through h16 are stored, multipliers 5401 through 5416, adders 5501 through 5514, and a data selector 5600.

Serial data (Din) are inputted into the shift register 5100 in synchronization with clocks (CLK1) of 4.096 Mhz.

As has been made clear in FIG. 10, the shift register 5100 of 8 bits is configured so as to be folded between the front stage of four bits and the rear stage of 4 bits.

Furthermore, the data distributors 5211 through 5214, respectively, have two input ends (A,B) and four output ends Y1 through Y4. And the input data at the input end A is distributed by time-sharing in the order of output ends Y1, Y2, Y3, and Y4 while the input data at the input end B is distributed by time-sharing in the order of output ends Y4, Y3, Y2, and Y1.

Furthermore, the data distributor 5211 is in charge of distributing data regarding the first through fourth taps and the twenty-ninth through thirty-second taps, the data distributor 5212 is in charge of distributing data regarding the fifth through eighth taps and the twenty-fifth through twenty-eighth taps, the data distributor 5213 is in charge of distributing data regarding the ninth through twelfth taps and the twenty-first through twenty-fourth taps, and the data distributor 5214 is in charge of distributing data regarding the thirteenth through sixteenth taps and the seventeenth through twentieth taps.

Furthermore, as has been made clear in FIG. 10, as regards the digital filter coefficients, only sixteen coefficients h1 through h16 equivalent to half at one side are prepared. Corresponding thereto, the number of multipliers 5401 through 5416 is also sixteen.

A group of adders 5501 through 5513 carry out addition of data as per output data in the abovementioned four states. The data selector 5600 alternately selects data inputted into the input ends A and B in synchronization with clocks CLK4 (16.384 Mhz) and output the data from the output terminal 5700.

Thus, a 32-tap digital filter having a 4-time zero interpolation feature can be achieved.

Figure 11:
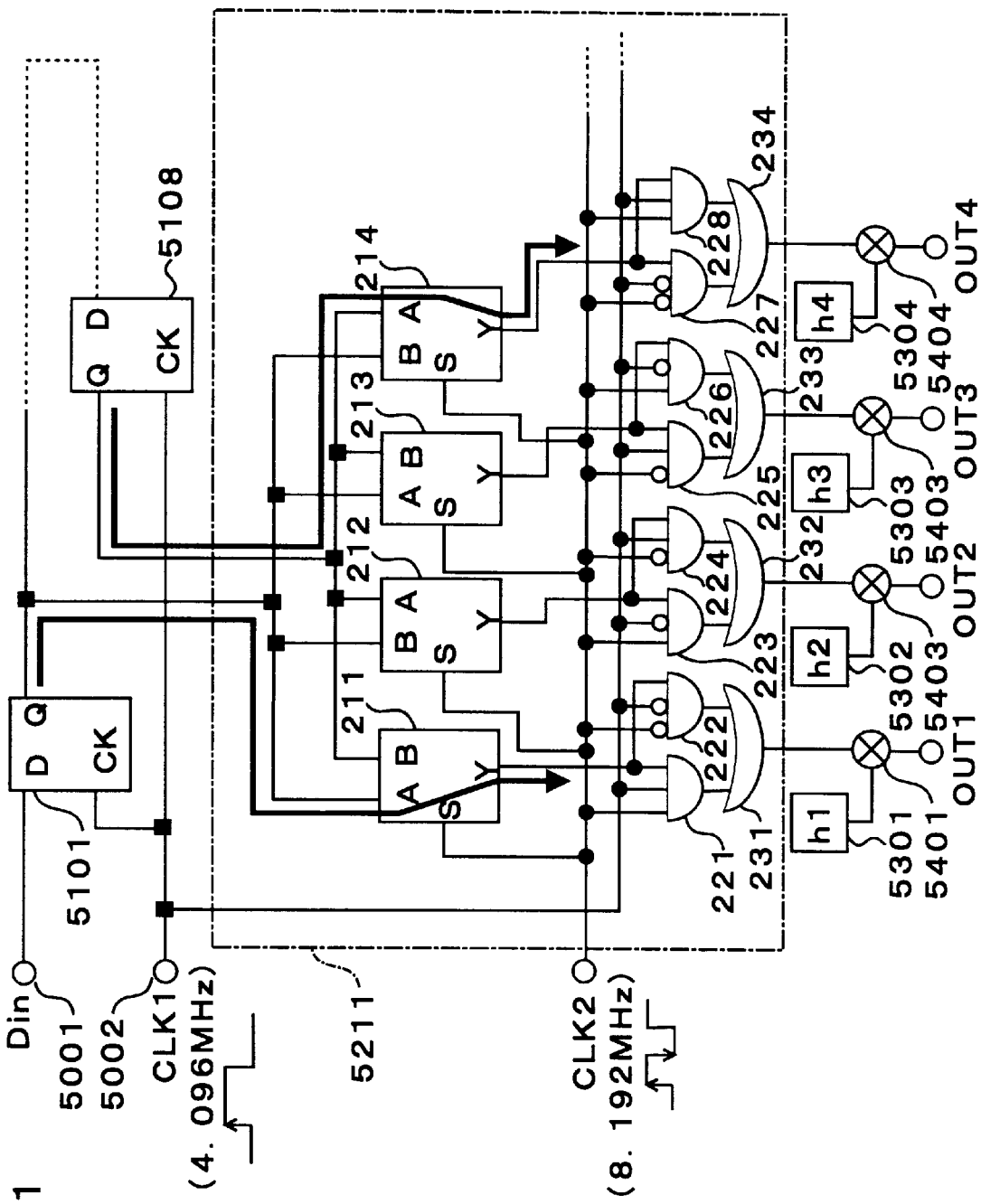
FIG. 11 is a circuit diagram of an example of the data distributor.

FIG. 11 shows one example of a detailed circuit configuration of data distributors 5211 through 5214.

The circuit illustrated in FIG. 11 is a detailed version of the circuit illustrated in FIG. 9.

The circuit illustrated in FIG. 10 counts clocks CLK4 (16.384 Mhz), using the counter 5200, whereby the data distributement is carried out by time-sharing at a rate which is higher by four times than that of the transfer rate of the shift register. However, in the circuit illustrated in FIG. 11, by devising the circuit configuration, the equivalent performance can be achieved by clocks whose frequency is lowered further than in the above. That is, in the data distributor illustrated in FIG. 11, data is distributed by using CLK1 (4.096 Mhz) and CLK2 (8.192 Mhz).

Figures 12A, 12B:
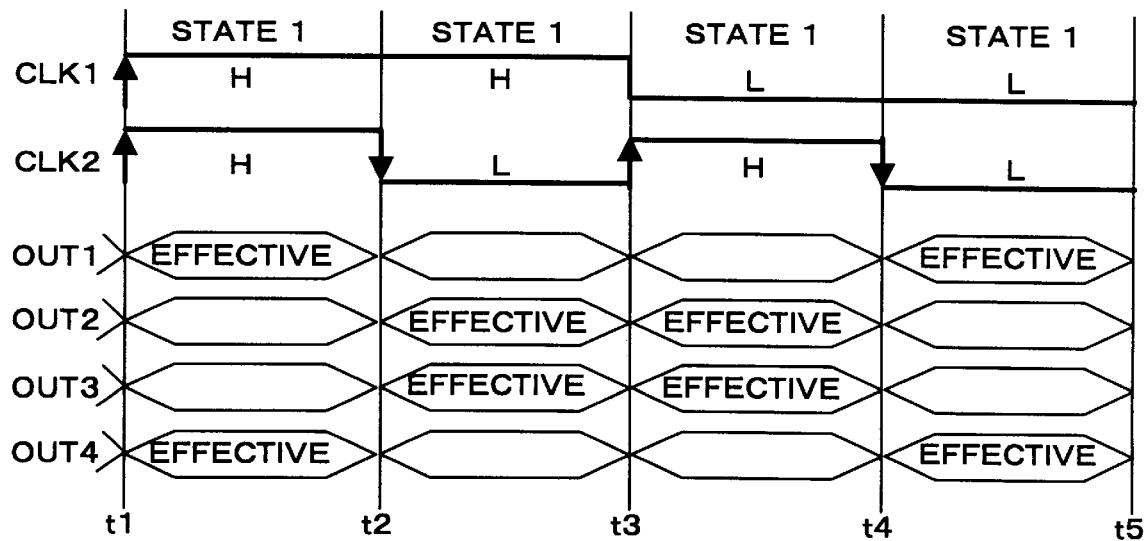
FIG. 12A is a view showing the transition of output data of the data distributor.
FIG. 12B is a timing chart showing actions of the data distributor.

FIG. 12A shows the details of data outputted from the circuit illustrated in FIG. 11, with respect to the state 1 through state 4, and FIG. 12B shows which ones of the four output terminals OUT1 through OUT4 are made effective with respect to the respective levels of clocks CLK1 and CLK2.

As has been made clear in FIG. 11, the data distributor 5211 is provided with data selectors 211 through 214 and a plurality of logic gates 221 through 228, 231 through 234.

The data selectors 211 through 214 are edge trigger type selectors which select the data inputted into end A in synchronization with a positive edge (UP edge) of clock CLK2, and select the data inputted into end B in synchronization with a negative edge (DOWN edge) thereof.

First, as CLK1 and CLK2 are changed to HIGH level at time t1 in FIG. 12B, AND gates 221 and 228 among a group of AND gates illustrated in FIG. 11 are made effective between time t1 and time t2 while the outputs of the other AND gates 222 through 227 are forcibly fixed at zero.

Therefore, data inputted from the D type flip flop 5101 in FIG. 11 is outputted via the selector 211, AND gate 221, and OR gate 231. On the other hand, the data inputted from the D type flip flop 5108 is outputted via the selector 214, AND gate 228 and OR gate 234. Therefore, the data are outputted from the output terminals OUT1 and OUT4.

Clock CLK2 is changed to LOW level at time t2 in FIG. 12B. Then, the selectors 211 through 214 illustrated in FIG. 11 is switched to a mode for selecting data inputted into the terminal B in synchronization with the DOWN edge. The AND gate 223 and AND gate 226 are made effective between time t2 and time t3 while the outputs of the other AND gates are forcibly fixed at zero. Therefore, the data inputted from the D type flip flop 5101 is outputted via the selector 212, AND gate 223, and OR gate 232 while the data inputted from the D type flip flop 5108 is outputted via the selector 213, AND gate 226 and OR gate 233. Accordingly, data are outputted from the output terminals OUT2 and OUT3.

By operations similar thereto, the data inputted from the D type flip flop 5101 is outputted from the output terminal OUT3 via the selector 213, AND gate 225 and OR gate 233 between time t3 and time t4 while the data inputted from the D type flip flop 5108 is outputted from the output terminal OUT3 via the selector 212, AND gate 224, and OR gate 232.

Furthermore, by operations similar thereto, the data inputted from the D type flip flop 5101 is outputted from the output terminal OUT4 via the selector 214, AND gate 227 and OR gate 234 while the data inputted from the D type flip flop 5108 are outputted from the output terminal OUT1 via the selector 211, AND gate 222 and OR gate 231.

Thus, simultaneous data distributement of the two series described with reference to FIG. 9 is achieved. The data outputted from the respective output terminals OUT1 through OUT4 corresponding to the states 1 through 4 converts as shown in FIG. 12A.

The data distributor shown in FIG. 11 is able to distribute data at a rate which is higher by four times than that of the transfer rate of symbol data, utilizing the edge of clock (CLK2) having a frequency higher by two times than that of the symbol clock (CLK1). Therefore, power consumption can be suppressed to such a degree that the clock frequency used can be decreased.

Third Embodiment

Next, a description is given of a third embodiment of the invention.

Figure 14:
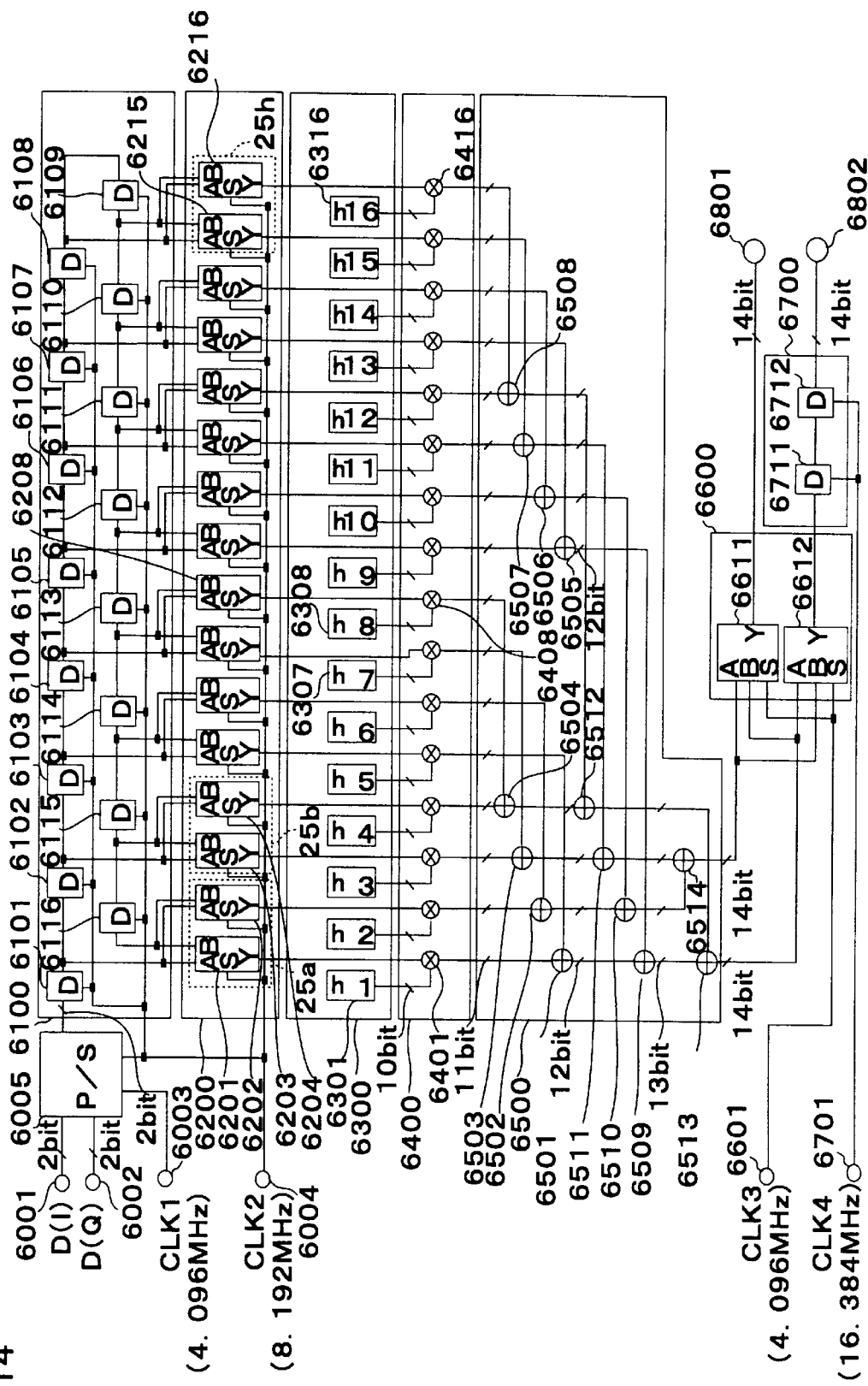
FIG. 14 is a block diagram of the digital filter according to the third embodiment of the invention.

FIG. 14 shows a configuration of a 4-time zero-interpolation FIR digital filter according to this embodiment.

Figure 13A:
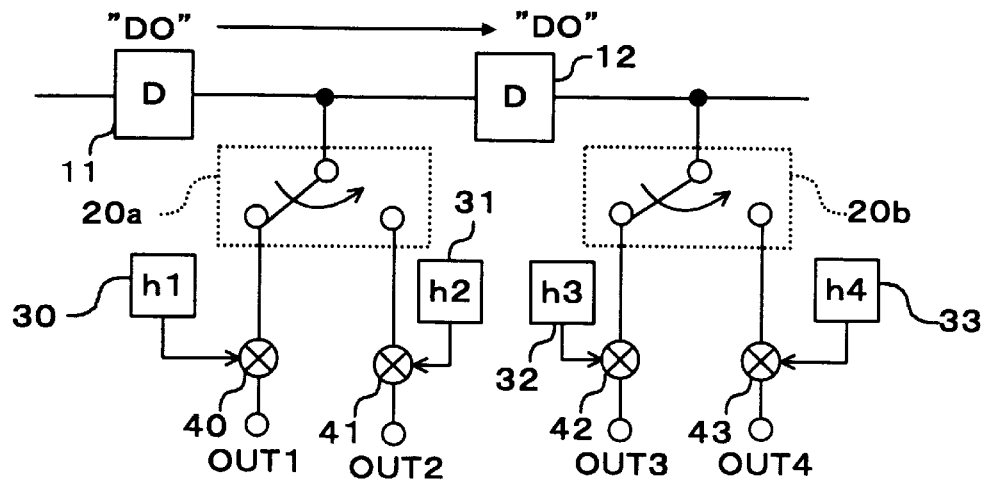
FIG. 13A is a circuit diagram explaining the basic actions of a digital filter according to a third embodiment of the invention.
Figure 13B:
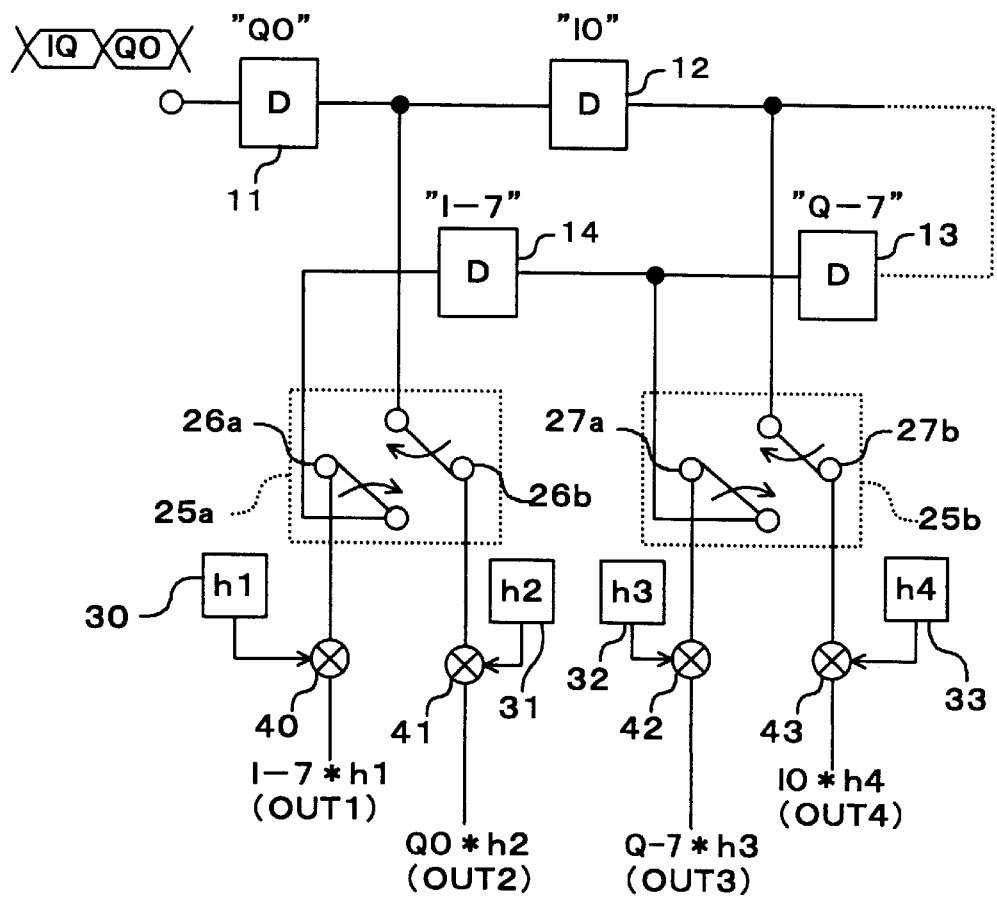
FIG. 13B is a circuit diagram explaining the detailed actions of the digital filter according to the third embodiment of the invention.

Before explaining the construction and actions of the digital filter, a description is given of the features of a digital filter illustrated in FIG. 14, with reference to FIG. 13A and FIG. 13B.

As shown in FIG. 12A and FIG. 12B, in the case of the second embodiment, only two output terminals among the four output terminals OUT1 through OUT4 are simultaneously made effective, wherein while data are being outputted from two output terminals, the other two output terminals remain fixed at zero level.

To eliminate such futility, if it is devised that data are simultaneously outputted from all output terminals OUT1 through OUT4, a parallel process (simultaneous process) of four data is enabled, wherein a very efficient filtering process can be carried out.

Figure 17A:
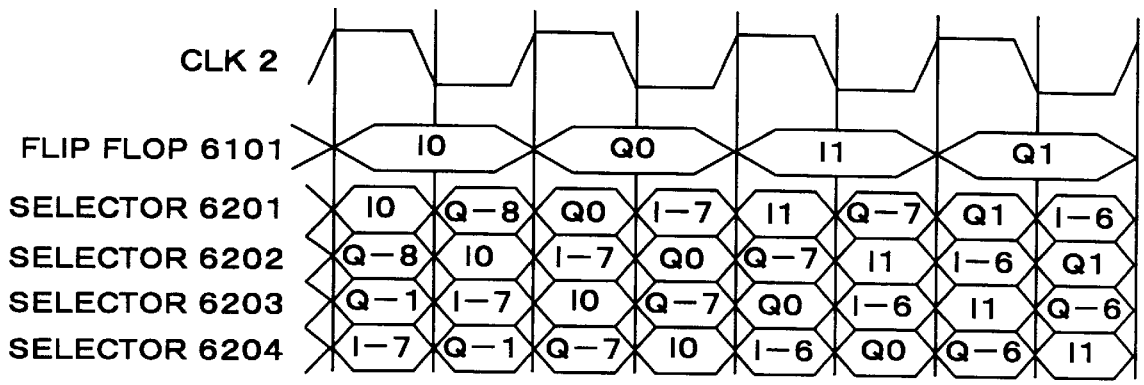
FIG. 17A is a timing chart showing the transition of output data of a data distributor according to the third embodiment of the invention.

In view of the above, in this embodiment, as shown in FIG. 17A and FIG. 18A, a parallel process (simultaneous process) of four series of data is achieved, wherein the circuit scale can be remarkably reduced, and power consumption can be reduced as well.

In this embodiment, first, two different series of serial data are multiplexed to be one series of serial data. Herein, one of the data series to be multiplexed is defined as I data series while the other data series is defined as Q data series.

The I data series is, for example, serial data of the inphase component in the QPSK modulated signals, and the O data series is a serial data of the quadrature components (Quadraphase). A pair of data in the respective series are data which are inherently processed in parallel to each other.

In a case where the transfer frequency (transfer rate) of data in each of the I and Q series is made f1, the transfer frequency (transfer rate) becomes 2*f1 if these two series of data are multiplexed to be one-series serial data. Therefore, the transfer rate of serial data inputted into a digital filter according to the embodiment is two times that of the abovementioned embodiment. Furthermore, as described above, the frequency (distributement rate) of data distributement becomes 4*f1 in a case wherein a 4-time zero interpolation is carried out by a data distributement of a time-sharing system.

Figure 17B:
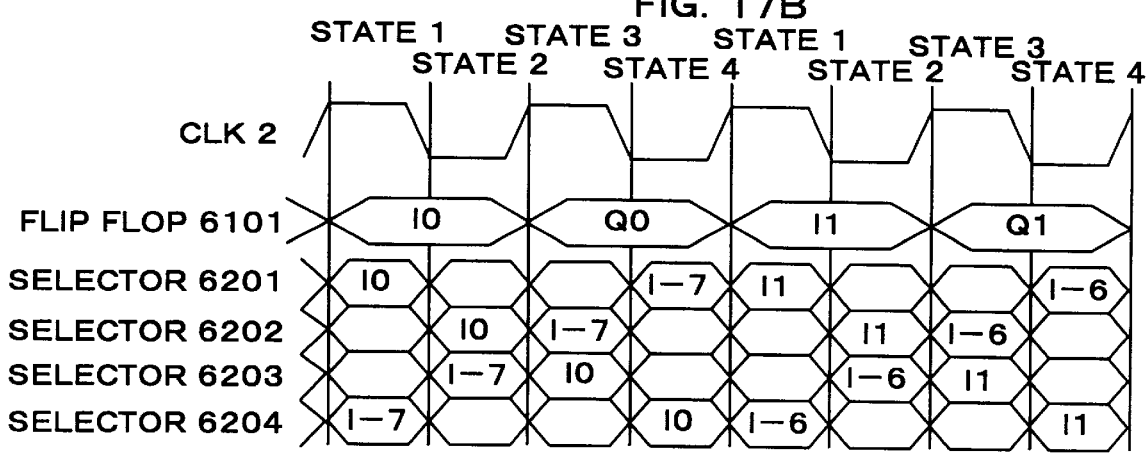
FIG. 17B is a timing chart showing the distributing condition of I channel data of the data distributor.
Figure 17C:
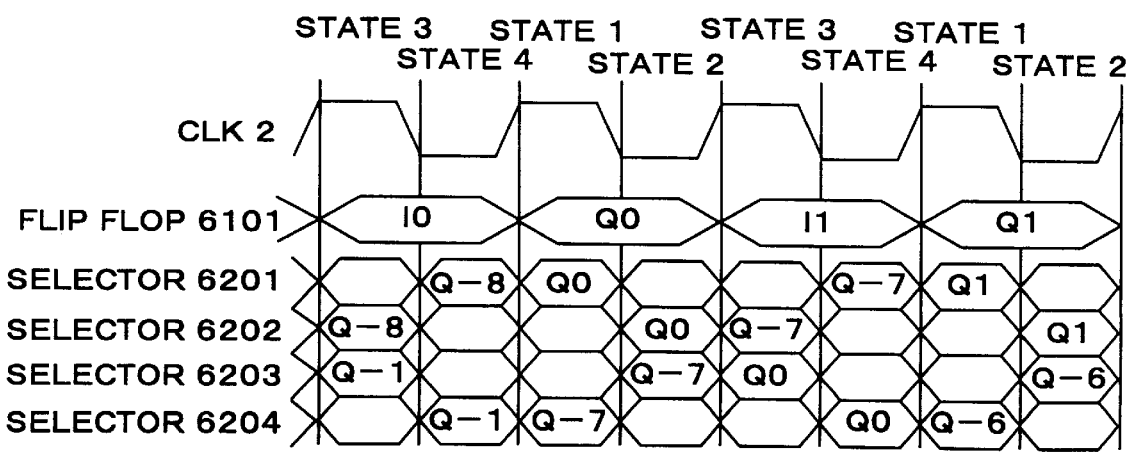
FIG. 17C is a timing chart showing the distributing condition of Q channel data of the data distributor.

Herein, multiplexed serial data is now taken into consideration. As shown in FIG. 17A through FIG. 17C, since the I series data I0, I1 . . . and Q series data Q0, Q1 . . . are alternately inserted, the phases of the I series data and Q series data are different from each other. The gap amount of the phases is two times the cycle of the data distributement.

Therefore, as shown at the left side in FIG. 18, when the I series data is in transition in the order of state 1, state 2, state 3 and state 4, the Q series data are shifted in the order of state 3, state 4, state 1 and state 2. That is, the I series data slips by two states from the Q series data in the state at the same time.

Herein, notice is taken of FIG. 12A and FIG. 12B showing actions of the abovementioned embodiment. As has been comprehensive in these drawings, in the state 1 and state 4, output is obtained from the output terminal 1 and output terminal 4. At this time, the output terminals OUT2 and OUT3 are fixed at zero level. Furthermore, in the state 2 and state 3, output is obtained from the output terminals 2 and output terminal 3. At this time, the output terminal 1 and output terminal 4 are fixed at zero level.

Therefore, if the Q series data is in the state 3 when the I series data is in the state 1, the I series data is outputted from the output terminals OUT1 and OUT4 while the Q series data is outputted from the output terminals OUT2 and OUT3. Resultantly, it will become possible to simultaneously obtain output from the output terminals OUT1 through OUT4.

On the basis of such a principle, in this embodiment, since a parallel process (simultaneous process) of four pieces of data is enabled so that data are simultaneously outputted from all four output terminals OUT1 through OUT4, a very efficient filtering process can be achieved.

FIG. 13A and FIG. 13B are views explaining the basic actions of a data distributor used to achieve such a parallel process.

In this embodiment, since, as described above, the transfer frequency of serial data is two times that of the abovementioned embodiment, the number of the D type flip flops (delay elements) is made two times that in the case of the abovementioned embodiments.

However, also in the data distributor according to this embodiment, one-series data are distributed by time-sharing at a frequency which is higher by four times than that of the transfer frequency of the data, thereby achieving a 4-time zero interpolation as in the abovementioned embodiments. Therefore, this data distributor is identical to that referred to in the abovementioned embodiments in such a view.

As shown in FIG. 13A, the data distributor (switch) 20a distributes data into two channels one after another during the period in which the data D0 is held by the flip flop 11. Resultantly, multiplication outputs h1 *D0 and h2*D0 are obtained one after another from the output terminals OUT1 and OUT2.

Next, the data D0 is transferred to the flip flop 12. During the period in which the data D0 is held by the flip flop 12, the data distributor 20b distributes the data D0 into two channels one after another. As a result, multiplication outputs h3*D0 and h4*D0 are obtained one after another from the output terminals OUT3 and OUT4. Thus, the data D0 is distributed to the output terminals OUT1 through OUT4 by time-sharing.

In this embodiment, as shown in FIG. 13B, the shift register is folded at the center, the data held by a pair of flip flops (flip flops 11 and 14, flip flops 12 and 13) located at the symmetrical position are inputted into the data distributors 25a and 25b in parallel to each other.

The data distributor 25a distributes one of the two inputted data into the terminal 26a and terminal 26b one after another, and distributes the other data into the terminal 26b and terminal 26a one after another. That is, such operations are cyclically repeated. Similarly, the data distributor 25b distributes one of the two inputted data into the terminal 27a and terminal 27b one after another, and distributes the other data into the terminal 27b and terminal 27a one after another. That is, such operations are cyclically repeated.

In FIG. 13B, data Q0 is held in the flip flop 11, data I0 is held in the flip flop 12, data Q-7 is held in the flip flop 13, and data I-7 is held in the flip flop 14. Subsequently, I-7*h1 is outputted from the output terminal OUT1, Q0*h2 is outputted from the output terminal OUT2, Q-7 *h3 is outputted from the output terminal OUT3, and I0*h4 is outputted from the output terminal OUT4.

Thus, in this embodiment, two series of data can be simultaneously processed by a one-series processing circuit, and further the processing rate (operating speed of the shift register) is the same as the rate for processing one series of data by using a data distributement circuit according to the invention shown in FIG. 11. In comparison with the conventional example shown in FIG. 5, the operating frequency of the shift register is reduced by one half.

Furthermore, according to the embodiment, in comparison with a case where each of the two-series of data is individually processed by two digital filters, the number of shift registers, digital filter coefficients, multipliers, and adders become one-fourth (where the interpolation rate is x, then, 1/x), respectively. Therefore, a remarkable simplification of the circuit can be achieved along with reduction in the power consumption.

The abovementioned are the features of a digital filter according to the third embodiment.

Hereinafter, a description is given of a detailed configuration and actions of a digital filter according to this embodiment with reference to FIG. 14 through FIG. 18.

The digital filter illustrated in FIG. 14 is a 32-tap configured 4-time zero interpolation filter, which is provided with a parallel/serial converter 6005 which makes I series data D(I) and Q series data D(Q) into one-series data by multiplexing them, a shift register (delayunit) 6100 consisting ofDtype flip flops (delay elements) 6101 through 6116, a data distributor 6200 equipped with sixteen data selectors 6201 through 6216, digital filter coefficient storing circuits 6301 through 6316 in which digital filter coefficients h1 through h16 are stored, multipliers 6401 through 6416, adders 6501 through 6514, a data separating circuit 6600 by which two-series data are separated from each other, and a timing adjustment circuit 6700.

Hereinafter, a description is given of the outline of the circuit operation.

Two-series serial data D(I), D(Q) synchronized with clock CLK1 of 4.096 Mhz are inputted into and multiplexed in the parallel/serial converter circuit 6005, wherein they are made into one-series data.

The multiplexed serial data is inputted into the shift register 6100.

As illustrated, the shift register 6100 is folded in half at the connection point between the D type flip flop 6108 and D type flip flop 6109. Subsequently, the data held by apair of flip flops (delay elements) located at the symmetrical positions are inputted into A input terminal and B input terminal of a set of data selectors 6201 and 6202, 6203 and 6204, ... 6215 and 6216, respectively.

In FIG. 14, the set of data selectors are given reference numbers 25*a* through 25*h*. Furthermore, the data selectors 6200 through 6216 are equivalent to data distributors (switches) 25*a* and 25*b* in FIG. 13B. Detailed actions of data distributement are described later.

The multipliers 6301 through 6316 multiplies the data outputted from the respective Y output terminals of the data selectors 6201 through 6216 by the digital filter coefficients h1 through h16.

A group of adders 6501 through 6513 carry out addition of data per data of the respective series with the independency (linearity of I data and Q data) of two series of data D(I), D(Q) maintained.

That is, as shown in FIG. 13B, at the four output terminals OUT1 through OUT4 of one data distributor, when one series of data (for example, D(I)) is outputted from the output terminals OUT1 and OUT4, the other series of data (for example, D(Q)) is outputted from the output terminals OUT2 and OUT3. Such actions are cyclically repeated. Therefore, if the data obtained from the output terminals OUT1 and OUT4 are added to each other and the data obtained from the output terminals OUT2 and OUT3 are added to each other, two series of data are never mixed to each other.

In this viewpoint, the digital filter circuit illustrated in FIG. 14 distinguishes sixteen multipliers 6401 through 6416 four by four. It is assumed that a set of four multipliers corresponds to the abovementioned output terminals OUT1 through OUT4. Connection of a group of multipliers 6301 through 6316 and a group of adders 6501 through 6514, and connection of a group of adders to each other are determined so that the data addition in the abovementioned format can be carried out.

The data outputted from the adders 6513 and 6514 are inputted into the data separating circuit 6600. The data separating circuit 6600 consists of two data selectors 6611 and 6612 operating in parallel.

The respective data selectors are data selectors of two inputs which alternately switch to determine whether the data of input end A or that of the input end B is selected, in synchronization with the edge of clock CLK3 (4.096 Mhz). Thereby, Qseries data D(Q) are obtained from the data selector 6611 while I series data D(I) are obtained from the data selector 6612.

The I series data D(I) are inputted into the timing adjustment circuit 6700. The timing adjustment circuit 6700 consists of two D type flip flops 6711 and 6712. As has been made clear in FIG. 17A through FIG. 17C, the phase of the I series data D(I) is further advanced than that of the Q series data D(Q), and the I series data (DI) are outputted earlier. Therefore, by delaying the I series data, the output timing of both data is synchronized. The Q series data is outputted from the output terminal 6801, and the I series data is outputted from the output terminal 6802.

Next, a description is given of a detailed operation of data distributement in the data distributor 6200.

Figure 15:
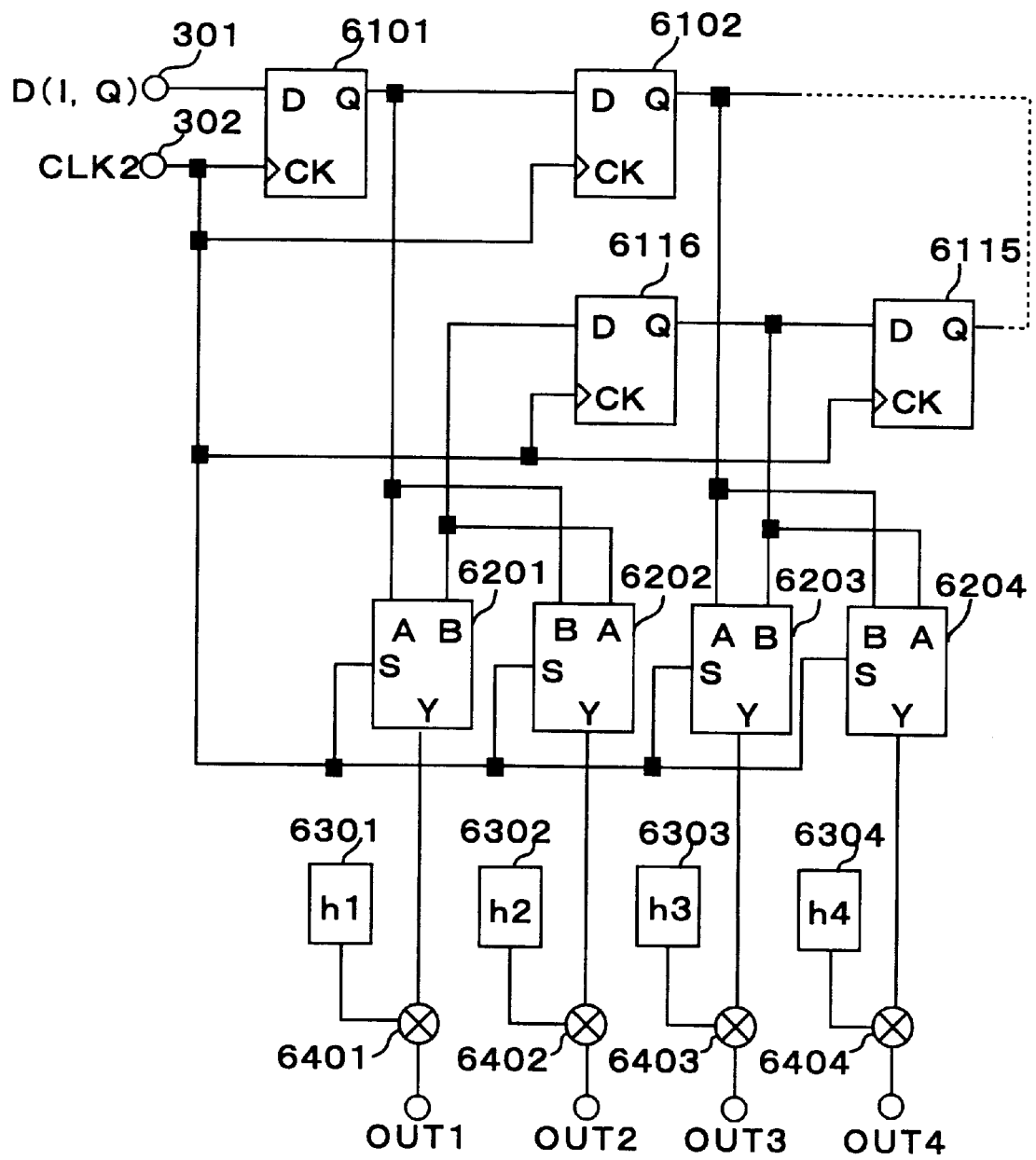
FIG. 15 is a block diagram showing a configuration of the data distributor.

FIG. 15 is a circuit diagram in which a part of the digital filter circuit illustrated in FIG. 14 is picked up and depicted.

Furthermore, each of FIG. 16A through FIG. 16D is a view showing the data channel corresponding to each of the four states in the circuit shown in FIG. 15. In these drawings, the data channels are shown by thick arrow markings.

Furthermore, the four data selectors 6201 through 6204 alternately switch the input end A or input end B with respect to whether either one of the data at the input end A or the data at the input end B is to be selected, in synchronization with the edge of clock CLK2.

Figure 16A:
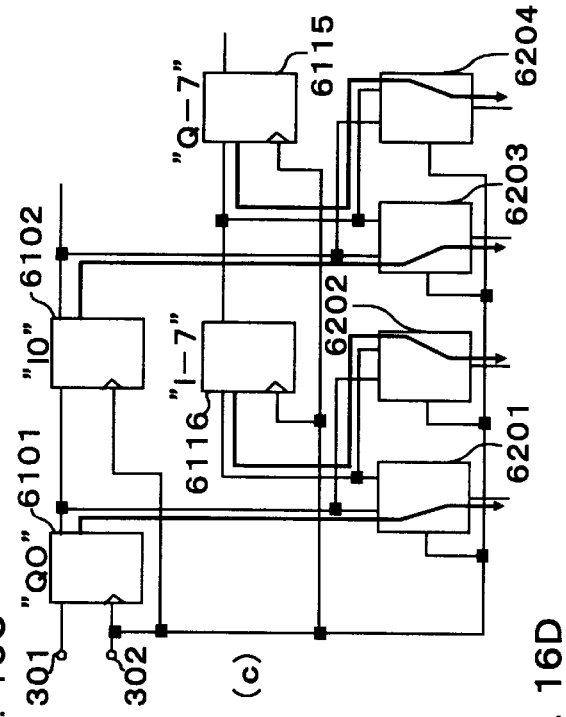
FIG. 16A is a circuit diagram showing a data output channel of a data distributor in the first state.
Figure 16B:
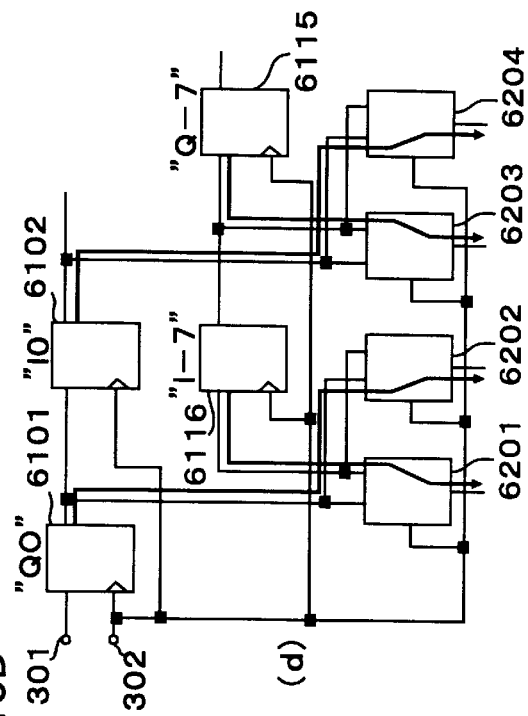
FIG. 16B is a circuit diagram showing a data output channel of a data distributor in the second state.

In FIG. 16A and FIG. 16B, data I0 is held in the flip flop 6101, and data Q-1 is held in the flip flop 6102, data 1–7 is held in the flip flop 6115, and data Q-8 is held in the flip flop 6116.

In the circuit illustrated in FIG. 16A, data I0 and I-7 are, respectively, outputted from the selectors 6201 and selector 6204 while the data Q-1 and Q-8 are, respectively, outputted from the selector 6202 and selector 6203.

In the circuit illustrated in FIG. 16B, data I0 and I-7 are, respectively, outputted from the selector 6202 and selector 6203, and the data Q-1 and Q-8 are, respectively, outputted from the selector 6204 and selector 6201.

Figure 16C:
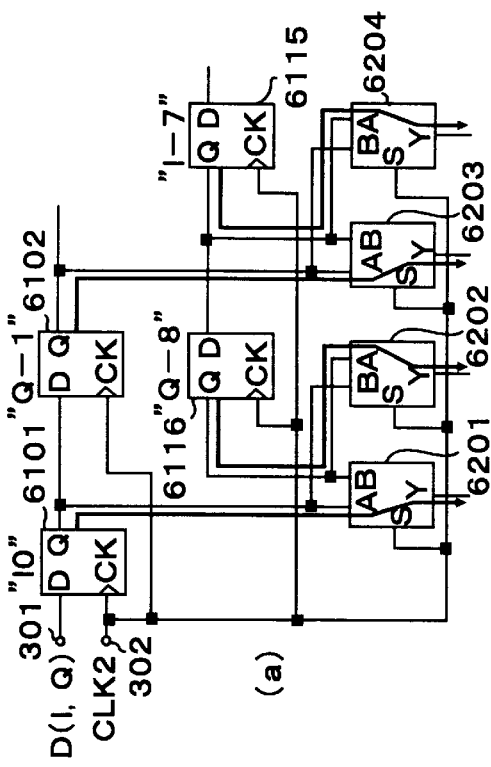
FIG. 16C is a circuit diagram showing a data output channel of a data distributor in the third state.
Figure 16D:
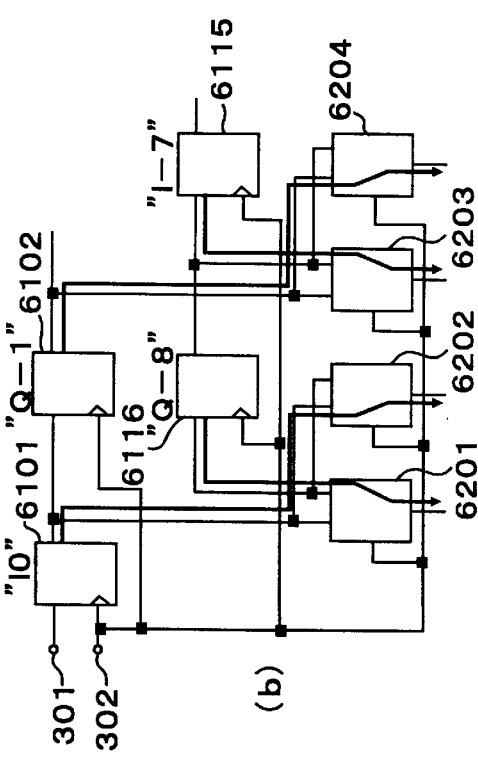
FIG. 16D is a circuit diagram showing a data output channel of a data distributor in the fourth state.

In FIG. 16C and FIG. 16D, the data held by the shift register is shifted one bit to the right. Resultantly, data Q0 is held in the flip flop 6101, data I0 is held in the flip flop 6102, data Q-7 is held in the flip flop 6115, and data I-7 is held in the flip flop 6116.

Subsequently, in the circuit illustrated in FIG. 16C, data Q0 and Q-7 are, respectively, outputted from the selector 6201 and selector 6204, and data I0 and I-7 are, respectively, outputted from the selector 6203 and selector 6202.

In the circuit illustrated in FIG. 16D, data Q0 and Q-7 are, respectively, outputted from the selector 6202 and selector 6203, and data I0 and I-7 are, respectively, outputted from the selector 6204 and selector 6201.

By a series of actions which are illustrated in FIG. 16A through FIG. 16D, data I0 are distributed by time-sharing in the direction from the selector 6201 to the selector 6204, and data I-7 is distributed by time-sharing in the direction from the selector 6204 to the selector 6201. Furthermore, data I-7 are outputted via the selector 6202 and selector 6201, thereby achieving a parallel process (simultaneous distributing process) of four data.

FIG. 17A through FIG. 17C show the output data of the flip flop 6101 (the first stage of the flip flop in the shift register) and the chronological change of the respective output data of the selectors 6201 through 6204, in the digital filter circuit illustrated in FIG. 14.

As has been made clear in FIG. 17A, data are always outputted from the four selectors 6101 through 6204.

FIG. 17B shows the chronological change of the I series data, and FIG. 17C shows the chronological change of the Q series data. The phase of transfer (distributement) of the I series data slips from that of the Q series data. That is, when the I series data changes in the order of state 1, state 2, state 3, and state 4, the Q series data changes in the order of state 3, state 4, state 1, and state 2. By utilizing this phase slip, it becomes possible to carry out simultaneous processing of the four data as shown in FIG. 17A.

FIG. 18 is a view showing one example of combinations of data outputted in parallel from the four output terminals OUT1 through OUT4 in the circuit illustrated in FIG. 15. When the I series data changes in the order of state 1, state 2, state 3 and state 4, the Q series data changes in the order of state 3, state 4, state 1 and state 2, wherein the two states coexist at all times. Resultantly, it becomes possible to carry out a multiplying process in parallel, in which a pair of I data and a a pair of Q data are multiplied by an predetermined digital filter coefficient.

In the digital filter circuit illustrated in FIG. 14, since two-series data are processed simultaneously in one-series signal processing circuit, and furthermore a fold-over mechanism of the shift register is employed, the number of shift registers, digital filter coefficients used, multipliers and adders is converted into one-fourth (to 1/X when the interpolation ratio of data is x) in comparison with a case where two conventional circuits are operated in parallel.

Furthermore, it is possible to convert the operating frequency of the shift registers into one-second (to 2/X when the data interpolation ratio is x) of the conventional case. Therefore, the circuit configuration can be remarkably simplified, and the power consumption can be further reduced. In a case where the digital filter is made of integrated circuits, the occupation area thereof on the chip can be remarkably decreased, and the power consumption of the integrated circuits can be remarkably reduced.

Fourth Embodiment

Figure 19:
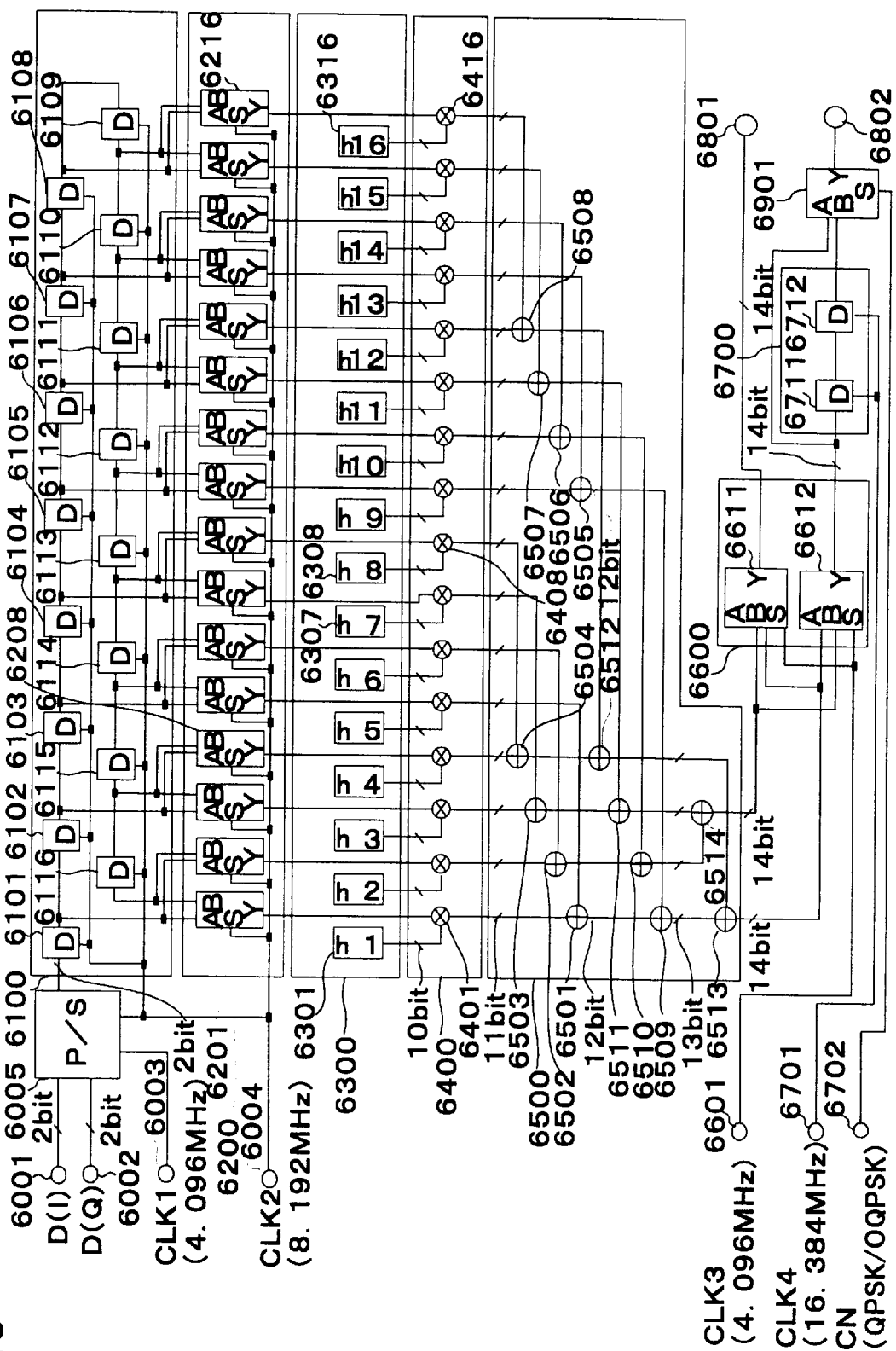
FIG. 19 is a block diagram of a digital filter according to a fourth embodiment of the invention.

FIG. 19 is a block diagram showing a configuration of a digital filter according to a fifth embodiment. A circuit according to this embodiment is almost the same as the circuit illustrated in FIG. 14.

However, in FIG. 14, although the I series output data are given certain delays due to passing through the timing adjustment circuit 6700 at all times, whereby it is constructed that both the I series and Q series data are simultaneously outputted, this embodiment is such that it can be optionally selected whether or not the data pass through the timing adjustment circuit 6700.

That is, the circuit illustrated in FIG. 19 is constructed so that a data selector 6901 is provided at the final output stage of the I series data, the output mode of the data selector 6901 is controlled by a control signal CN supplied from a control terminal 6702.

That is, the I series data which do not pass through the timing adjustment circuit 6700 and the I series data which has passed through the timing adjustment circuit are inputted into two input ends A and B of the data selector 6901, respectively, wherein, for example, when the control signal CN is at HIGH (H) level, the input of the end A is selected, and when the CN is at LOW(L) level, the input of the end B is selected.

In the case of the mode where the input of the terminal A of the data selector 6901 is selected, since the I series data is outputted without any delay resulting from the timing adjustment circuit 6700, the phase of the I series data is further advanced equivalent to half the time slot than that of the Q series data.

In this case, if one set of each of the I series and Q series (each channel) data is data equivalent to one symbol to be transmitted to another by using QPSK (Quadrature Phase Shift Keying) modulation, the I series (I channel) data is shifted equivalent to half the slot, wherein OQPSK (Offset Quadrature Phase Shift Keying) is achieved.

Therefore, the control signal CN to switch the mode of the data selector 6901 functions as a signal for switching QPSK/OQPSK.

As described above, with this embodiment, such a digital filter circuit can be achieved, by which both two-series data are simultaneously processed, and the phases of the respective series data can be slipped.

Thereby, it is possible to easily select whether, as a data modulation system, QPSK is used or OQPSK is used.

Fifth Embodiment

Figure 20:
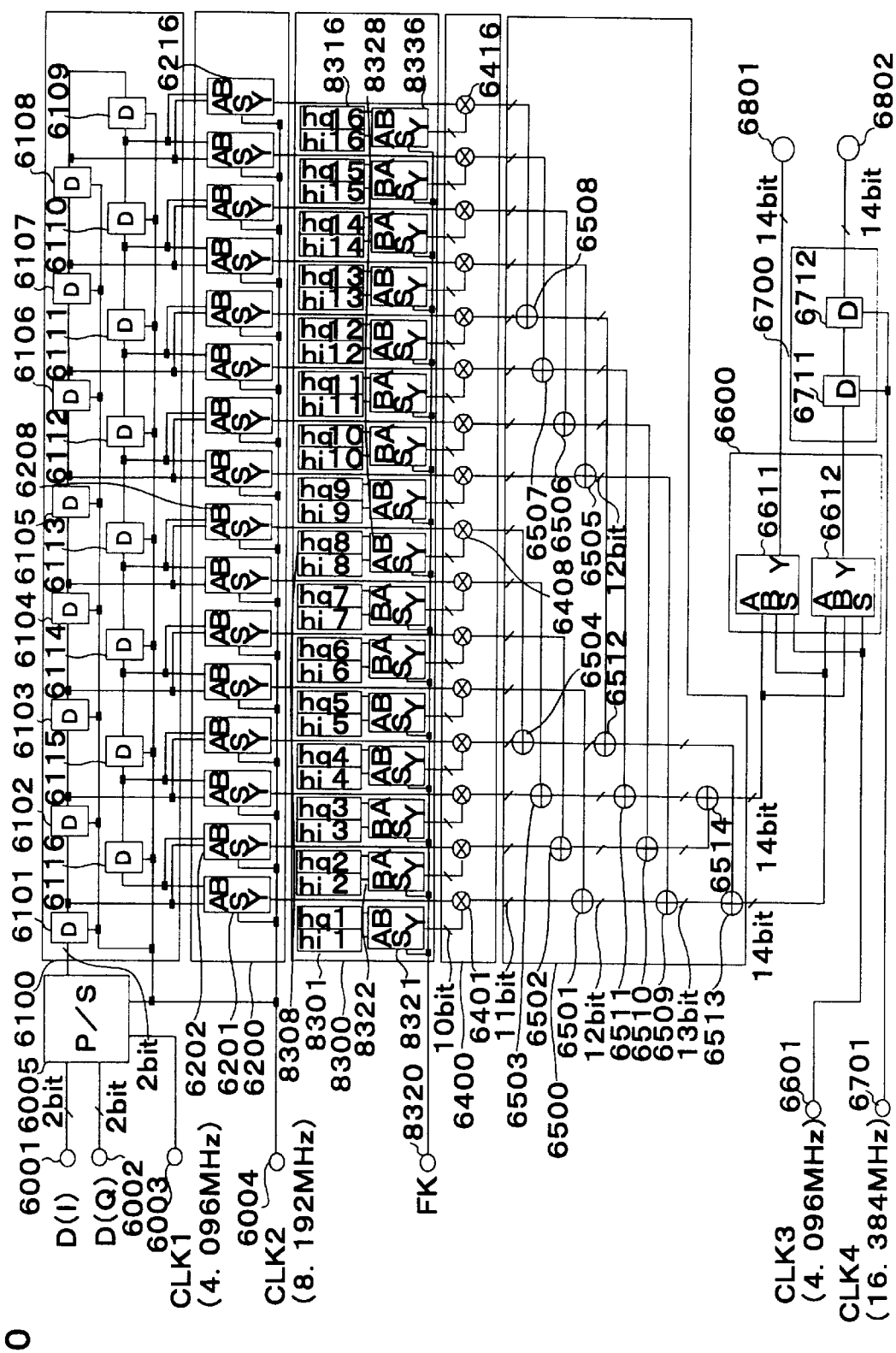
FIG. 20 is a block diagram of a digital filter according to a fifth embodiment of the invention.

FIG. 20 is a block diagram showing a configuration of a digital filter circuit according to the fifth embodiment.

The basic configuration of a circuit according to this embodiment is the same as the circuit illustrated in FIG. 14. However, although the digital filter coefficients (multiplication coefficients) are commonly used for each of the I- and Q series data in the circuit illustrated in FIG. 14, two types of digital filter coefficients are prepared so as to correspond to the respective series of data. There is a difference in this point.

In this embodiment, since it is possible to independently prepare digital filtering coefficients in the respective series of data, such an effect can be obtained, by which the degree of freedom in designing the circuits can be expanded.

In FIG. 20, a coefficient storing section 8300 is provided with coefficient storing sections 8301 through 8316 which store sixteen coefficients hi1 through hi16 by which the I series data is multiplied, and sixteen coefficients hq1 through hq16 by which the Q series data is multiplied, and sixteen coefficient selectors 8321 through 8336.

Each of the coefficient selectors 8321 through 8336 selects coefficients hi1 through hi16 for the I series data when the I series data are outputted from the data distributor, and selects coefficients hq1 through hq16 for the Q series data when the Q series data are outputted therefrom. Hereinafter, a detailed description is given.

In the circuit illustrated in FIG. 18, notice is taken of, for example, OUT1 among the four output terminals OUT1 through OUT4 of the data distributor. D(I), D(Q), D(Q), and D(I) are outputted one after another from the output terminal OUT1 in compliance with the elapse of time where it is assumed that the I series data is D(I) and the Q series data is D(Q).

In the circuit illustrated in FIG. 20, the output terminal of the selector 6201 which constitutes the data distributor corresponds to the output terminal OUT1. Therefore, it is necessary that the coefficient selector 8321 selects a coefficient in the order of a coefficient at the input end A, a coefficient at the input end B, a coefficient at the input end B, and a coefficient at the input end A.

As well, as regards the output terminal OUT2 in FIG. 18, the output data change in the order of D(Q), D(I), D(I), andD(Q) in this order in compliance with the elapse of time. In the circuit illustrated in FIG. 20, the output terminal of the data selector 6202 which constitutes the data distributor corresponds to the output terminal OUT2. Therefore, it is necessary that the coefficient selector 8322 selects a coefficient in the order of a coefficient at the input end A, a coefficient at the input end B, a coefficient at the input end B, and a coefficient at the input end A. That is, the order of the input ends selected by the coefficient selector 8322 is the same as that of the coefficient selector 8321.

The other coefficient selectors 6203 through 6216 in the circuit illustrated in FIG. 20 select a coefficient in the order of a coefficient at the input end A, a coefficient at the input end B, a coefficient at the input end B, and a coefficient at the input end A as in the above. Such selection actions are cyclically repeated.

Such a selection (switching of coefficients) of coefficients in the coefficient selectors 8321 through 8336 as described above is carried out in synchronization with the edge of switching clock FK supplied from the terminal 8320.

Thus, in the circuit of the embodiment, since two types of digital filtering coefficients are switched and used for the respective series of data, the degree of freedom of a filtering process can be increased.

Furthermore, the coefficient holding circuits 8301 through 8316 which hold digital filter coefficients hi1 through hi16 and hq1 through hq16 are composed of random access memories (RAM), and it is possible to renew coefficients from time to time. In this case, it is possible to individually change the gain of the digital filter with respect to the respective series of data. This point is described later with reference to FIG. 24.

Sixth Embodiment

Figure 21:
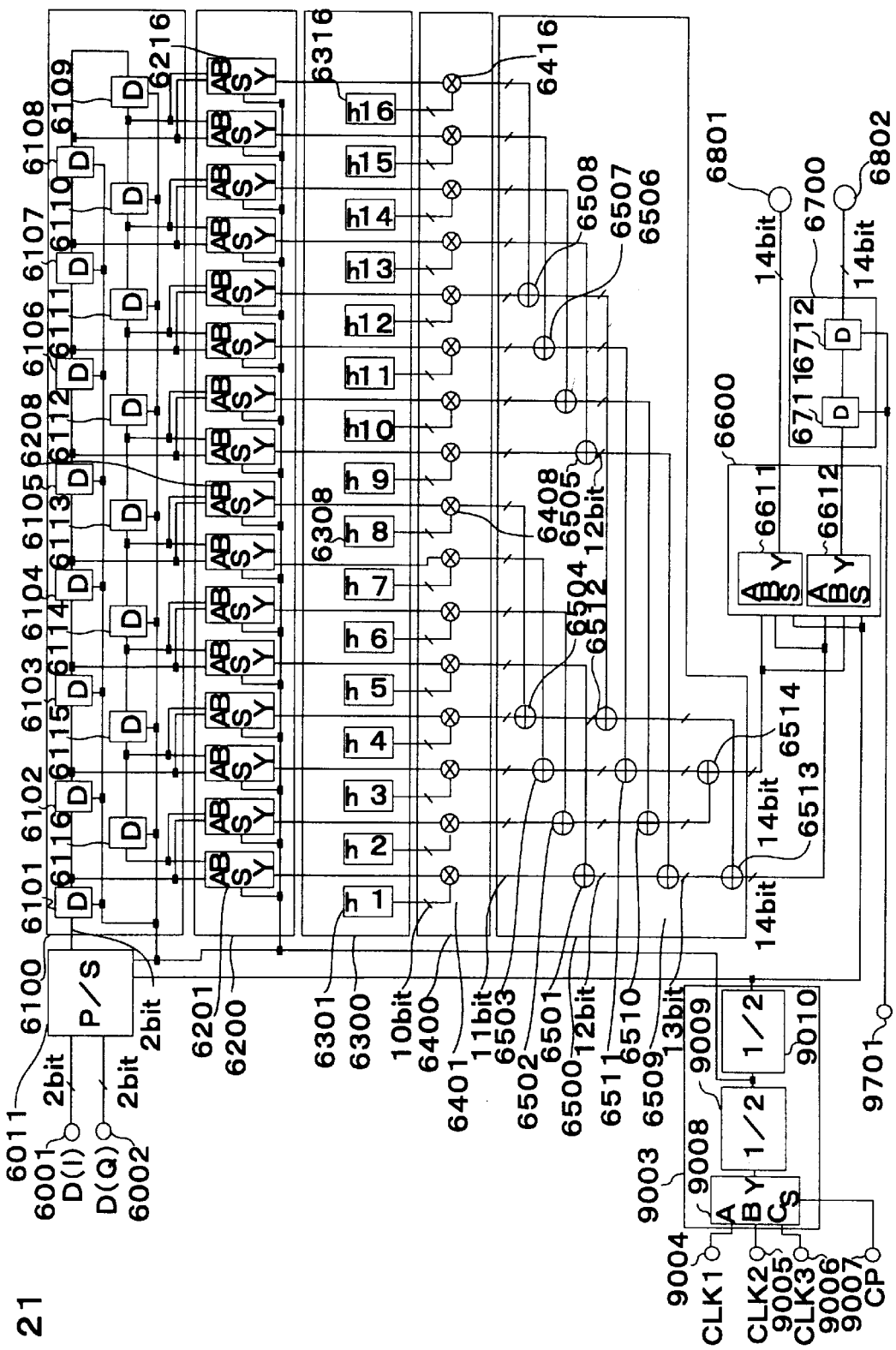
FIG. 21 is a block diagram of a digital filter according to a sixth embodiment of the invention.

FIG. 21 is a block diagram of a digital filter circuit according to a sixth embodiment.

The basic configuration of the circuit illustrated in FIG. 21 is identical to the circuit illustrated in FIG. 14.

However, the circuit according to this embodiment is composed so that the operating speed of the shift registers, etc., can be adequately changed by employing a clock frequency changer 9003, whereby the operating speed of the digital filter is easily adapted to the operating speed of peripheral circuits while, to the contrary, it is possible to freely establish the internal processing speed of the digital filter circuit independent from the operation of the peripheral circuits.

The clock frequency changer 9003 is provided with a clock selector 9008 for selecting one of a plurality of clocks CLK1 through CLK3, the frequencies of which are different from each other, and two one-second frequency dividers 9009 and 9010. The clock selector 9008 selects any one of the clocks CLK1 through CLK3 in compliance with the level of the control signal CP inputted into the control terminal 9007. Therefore, by adequately establishing the level of the control signal CP, the digital filter can be operated at a desired frequency.

Furthermore, in FIG. 21, operating clocks of the timing adjustment circuit 6700 are supplied from an independent terminal 9701. Therefore, by selecting the frequency and phase of clocks supplied from the terminal 9701, the data output timing can be adjusted independently from the processing rate inside the digital filter.

That is, the timing adjustment circuit 6700 functions as an output interface circuit which adjusts the timing of transmitting data to other circuits as well. Therefore, it becomes possible to micro-adjust the timing in the case of transmitting the OQPSK modulation data to other circuits.

Seventh Embodiment

Figure 22:
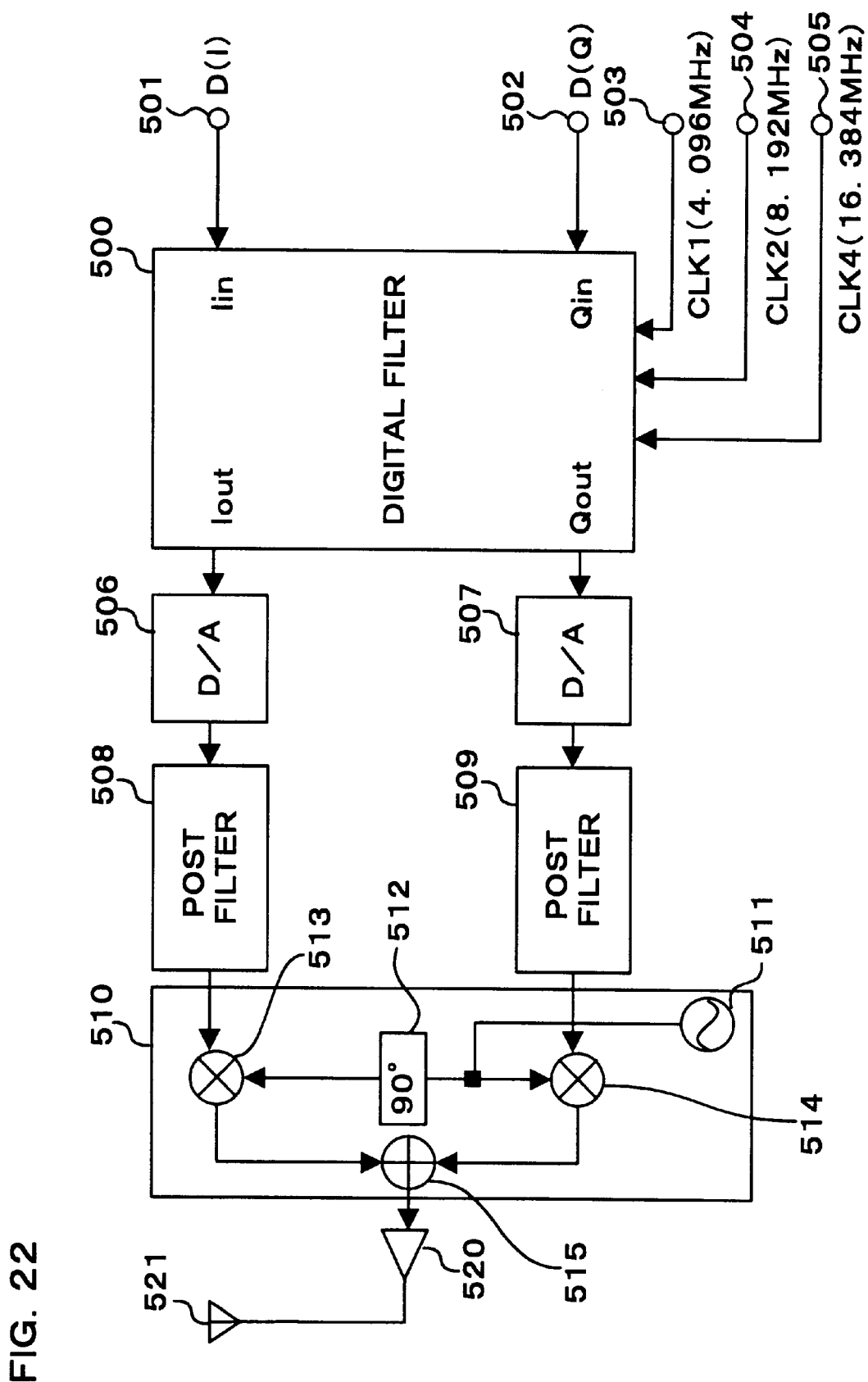
FIG. 22 is a block diagram of a communication apparatus according to a seventh embodiment of the invention.

FIG. 22 shows the outline of the configuration of a transmitter in which a digital filter (FIG. 14) described with respect to the abovementioned third embodiment is used.

The transmitter illustrated in FIG. 22 is a transmitter for mobile transmission, in which, for example, the QPSK (or OQPSK) is used as a modulation system. In this transmitter, the digital filter is used to limit the band of transmission data before digital-analog conversion.

The transmitter illustrated in FIG. 22 has a band limiting filter (digital filter) 500, digital/analog converter 506 and 507, post filters 508 and 509, an orthogonal modulator 510, a transmission amplifier 520, and an antenna 521.

The orthogonal modulator 510 is provided with a cosine wave generating circuit 511, a delay unit 512 for giving 90 phase delay to the cosine waves, multipliers 513 and 514, and a signal synthesizer 515. As described above, the band limiting filter (digital filter) 500 is a filter referred to in FIG. 14, which has already been described in the abovementioned third embodiment.

The inphase component data D(I) and quadrature component data D(Q) of the QPSK modulation data are, respectively, inputted into the band limiting filters 501 and 502. Furthermore, clock CLK1 (4.096 Mhz), clock CLK2 (8.192 Mhz), and clock CLK4 (16.384 Mhz) are, respectively, supplied from the terminals 503 through 505.

The transmission data of the respective channels I and Q, which passed through the digital filter 500 are, respectively, converted to analog signals by the digital/analog converters 506 and 507, and are inputted into the orthogonal modulator 510, passing through the post filters 508 and 509.

In the orthogonal converter 510, data of the respective channels I and Q are multiplied by sine waves and cosine waves, thereby causing the signals of each channel to be synthesized, wherein QPSK modulated transmission signals can be obtained. The transmission signals are transmitted to another party via the antenna 521 after they are amplified by the amplifier 520 at the final stage.

As described above, the digital filter 500 is able to simultaneously process two series of data by one-series of signal processing circuit, and furthermore it employs a folding-back configuration of shift registers. As a result, the number of stages of the shift registers, number of digital filter coefficients used, and number of multipliers and adders can be decreased to one-fourth (1/x when the data interpolation ratio is made x) in comparison with a case where two conventional circuits are operated in parallel, and the operating frequency of the shift registers can be reduced to one-second (2/x when the data interpolation ratio is made x) of that of the conventional case.

Therefore, since the circuits can be remarkably simplified, and lower power consumption can be also achieved, these effects directly contribute to a downsizing of transmitters and a lowering of the power consumption. Therefore, a communication apparatus for mobile transmission, which is light in weight, small-sized, and ensures a longer service life, can be achieved.

Eighth Embodiment

Figure 23:
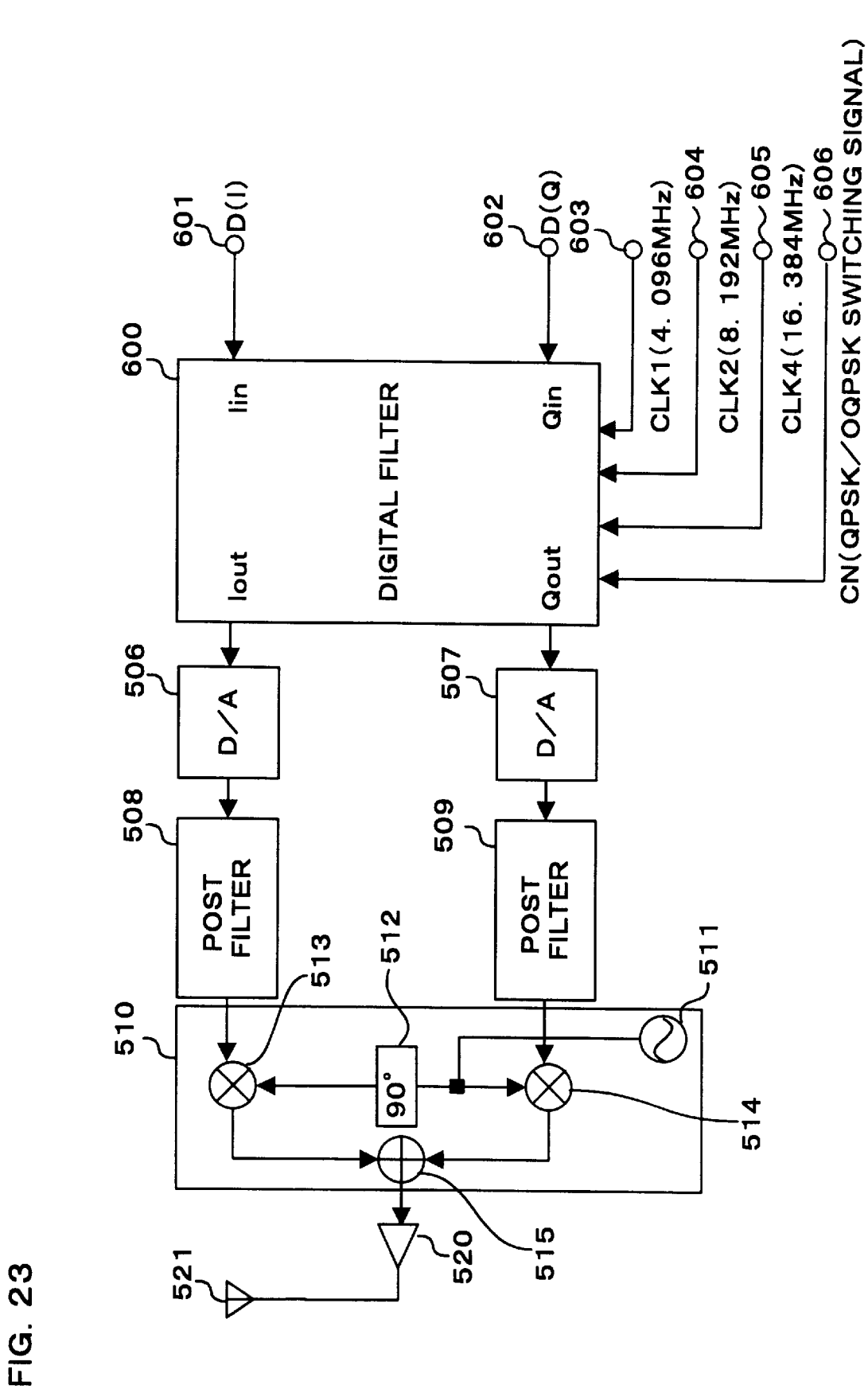
FIG. 23 is a block diagram of a communication apparatus according to an eighth embodiment of the invention.

In a transmitter illustrated in FIG. 23, a band limiting filter 600 is constructed by using a digital filter illustrated in FIG. 19, which has been described in the abovementioned fourth embodiment. All the other components are identical to those of a transmitter according to the seventh embodiment.

In a transmitter according to this embodiment, by inputting a control signal CN (QPSK/OQPSK switching signal)

from a control terminal 600, it is possible to adjust the output timing of the inphase component data D(I) and quadrature component data D(Q) of the QPSK modulation signal.

That is, the digital filter circuit 600 itself is given a feature of selecting whether or not a phase difference is given to the data of each channel of I and Q. Therefore, it is possible to freely select, as a modulation system, which one of QPSK modulation or OQPSK modulation is used.

Thereby, high performance can be achieved along with a downsizing and a lowering of power consumption of communication apparatuss.

Ninth Embodiment

Figure 24:
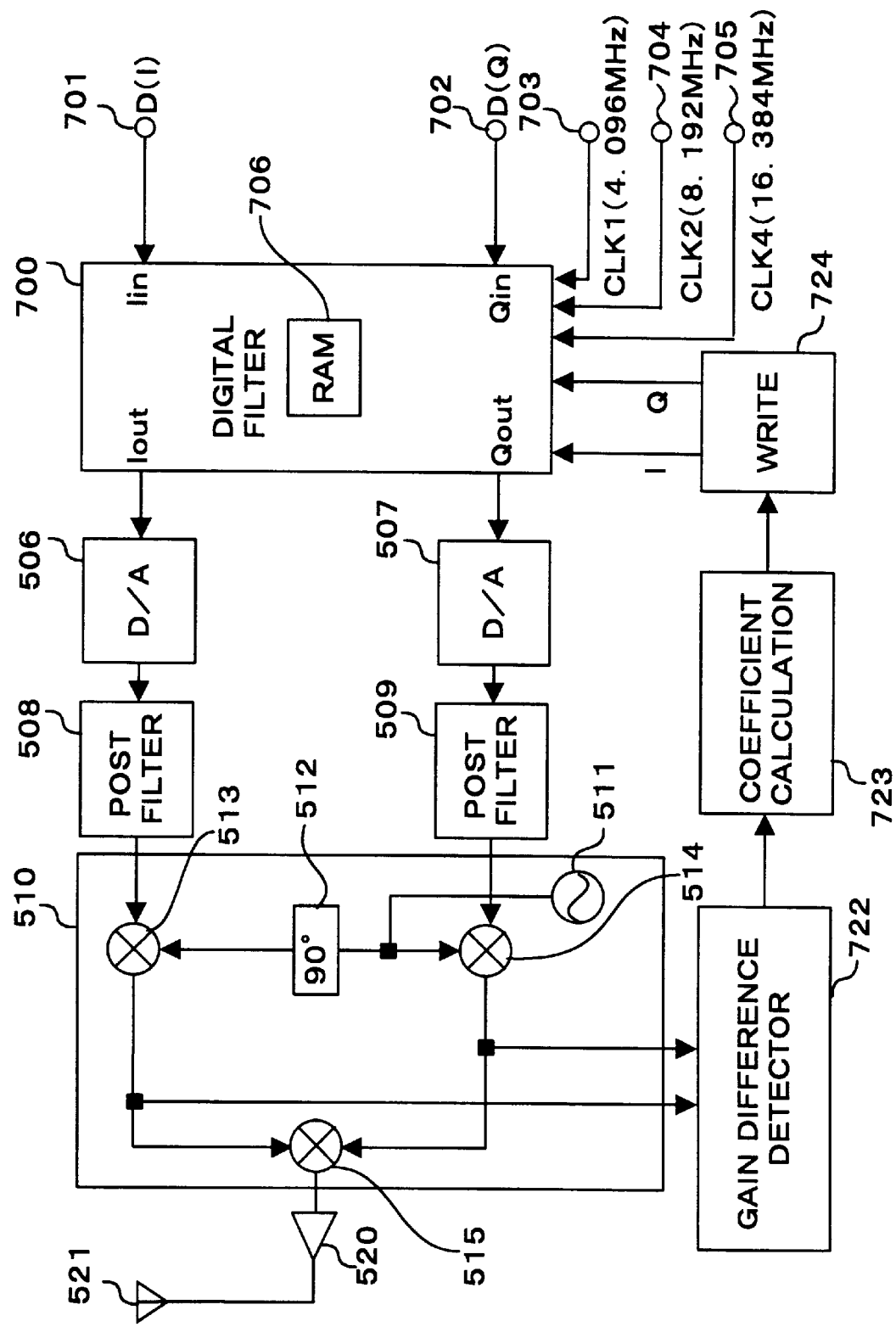
FIG. 24 is a block diagram of a communication apparatus according to a ninth embodiment of the invention.

FIG. 24 is a block diagram of a transmitter according to the ninth embodiment.

A transmitter according to this embodiment uses a digital filter described with reference to FIG. 20, which has been described in the abovementioned fifth embodiment, and simultaneously employs a configuration in which digital filter coefficients of each channel of I and Q are renewed at real time during transmission. Therefore, it is possible to lower a difference of transmission gain of transmission signals in each channel of I and Q.

As described above, the digital filter described with reference to FIG. 20 can establish digital filter coefficients hi1 through hi16 and hq1 through hq16 for each of the data in each channel of I and Q.

In this embodiment, the digital filter coefficients hi1 through hi16 and hq1 through hq16 of each channel are held in a RAM 706, and the respective held coefficients are rewritten from time to time, by using a writing circuit 724.

That is, the gain difference detector 722 detects a difference of the gain (amplitude) of transmission signals of each channel of I and Q, and outputs signals (gain differential signal) corresponding to the differential thereof. A coefficient calculation circuit 723 receives the gain differential signal, calculates the value of a digital filter coefficient necessary to reduce the gain difference, and sends it to the writing circuit 724.

The writing circuit 724 writes the digital filter coefficient of the calculated value in the RAM 706 provided in the digital filter circuit 700, wherein the digital filter coefficient is renewed.

Thereby, the gain of a channel for processing the data of each channel of I and Q in the digital filter circuit 700 may change, wherein the gain difference of transmission signals of each channel can be compensated.

Thus, in the transmitter illustrated in FIG. 24, a negative feedback loop is formed, which consists of a digital filter 700, digital/analog converters 506 and 507, post filters 508 and 509, an orthogonal modulator 510, a gain difference detector 722, a coefficient calculation circuit 723, and a writing circuit 724. The digital filter circuit 700 functions so as to adjust the gain of the negative feedback channel.

As in conventional examples, in the construction in which a digital filter circuit is provided in each channel of I and Q, the characteristics of the respective digital filters are different from each other, resulting in making the circuit configuration complicated. Therefore, it is difficult to carry out such a negative return control.

That is, since a digital filter 700 used in this embodiment can multiplex two channels of data and process at the same time, and further a digital filter coefficient can be established for each of data of the respective channels, it is possible to perform such a negative return control by which the transmission gain can be made equivalent as for transmission data in each channel of I and Q.

Thereby, the transmission quality can be improved in addition to a downsizing of a communication apparatus and a lowering of the power consumption.

Tenth Embodiment

Figure 25:
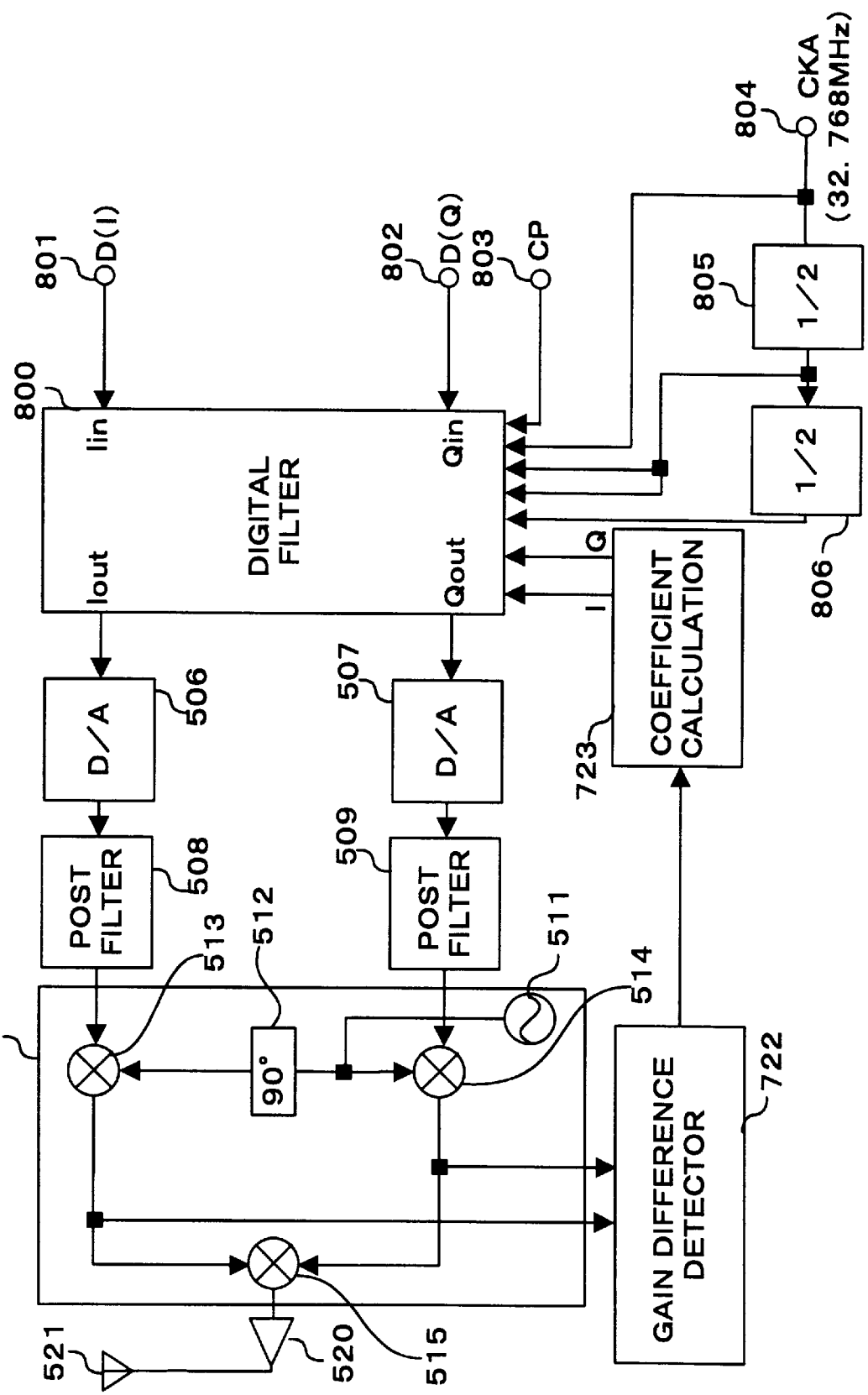
FIG. 25 is a block diagram of a communication apparatus according to a ninth embodiment of the invention.

FIG. 25 is a block diagram of a transmitter according to the tenth embodiment.

In a transmitter illustrated in FIG. 25, a frequency divider and ½ frequency dividers 805 and 806 are provided in order to generate a plurality of clocks whose frequencies are different from each other. A reference clock CKA of 32.768 Mhz is inputted into a clock input terminal 804, wherein the ½ frequency dividers 805 and 806 divide the reference clock CKA and generate a clock of an predetermined frequency, which is supplied to the digital filter circuit 800.

The digital filter circuit 800 is a filter (a filter referred to in FIG. 21) having a feature of selecting the frequency of a clock used, and selects an optimal clock among a plurality of clocks inputted, and a digital filtering process is carried out.

In a transmitter according to the embodiment, the operating speed of a digital filter is adapted to the operating speed of peripheral circuits. To the contrary, it is possible to easily and freely establish the processing speed in the digital filter circuits, independently from operations of the peripheral circuits.

The above description has been given of embodiments of the invention. However, the invention is not limited to these embodiments, wherein various modifications and variations are possible. For example, in the abovementioned embodiments, although a digital filter of a four-time interpolation (interpolation ratio x=4) is employed, the invention is also applicable to a digital filter of 4n-time interpolation (n is a natural figure more than 2).

Furthermore, a digital filter according to the invention can be widely utilized for, for example, filters for processing television picture signals in addition to a band limiting filter of a transmitter.

This application is based on the Japanese Patent Application No. HEI9-365287 filed on Dec. 20, 1997 and the Japanese Patent Application No. HEI10-345766 filed on Dec. 4, 1998, entire contents of which are expressly incorporated by reference herein.

What is claimed is:

1. An X-time interpolation FIR (Finite Inpulse Response) type digital filter whose interpolation ratio is x (x is an intrgral number of 4 or more) comprising:
   a data holding circuit which temporarily holds input data;
   a data distributor for distributing the held data into x different signal channels by time-sharing during the period in which said data holding circuit holds the same data; and
   a calculation circuit for carrying out predetermined calculations with respect to each of the x pieces of data outputed from said data distributor by time-sharing.

2. An X-time interpolation FIR type digital filter whose interpolation ratio is x (x is an integral number of 4 more) comprising:
   a delay unit of m stages (m is a natural FIG. 2 or more), in which serial data are inputted;
   m data distributors into which each of data of m bit outputted in parallel to each other from the respective stages of said delay unit are inputted, and which output the inputted data to each of x output terminals by time-sharing at a frequency which is x times the operating frequency of said delay unit;

m*x multipliers which multiply each piece of data outputted from each of said x output terminals of said data distributors by digital coefficients; and x groups of adders which add to each other m pieces of data outputted in parallel at the same timing among the data outputted by time-sharing from said m*x multipliers.

3. An X-time interpolation FIR type digital filter according to claim 2, wherein said digital filter is a zero insertion type digital filter which internally inserts zero-level data into inputted digital signals.

4. An X-time interpolation FIR type digital filter, the digital filter coefficients of which is configured to be even-ordered and even-symmetrical, and the interpolation ratio of which is x (x is an integral number of 4 or more), comprising:

a delay unit including delay elements composed of n stages (n is an even number of 2 or more), into which serial data are inputted;

n/2 data distributors, into which two pieces of data outputted in parallel from a pair of delay elements located at symmetrical positions where the pair of delay elements overlap each other when a delay unit including of said delay elements of n stages is folded over into half centering around the point of connection of the (n/2)th delay element and (n+1/2)th delay element, are inputted, and which output the respective inputted data to x output terminals by time-sharing at a frequency which is x times the operating frequency of said delay unit;

a coefficient holding circuit for holding coefficients equivalent to half at one side in said even-ordered and even-symmetrical digital filter coefficients; and a multiplier which multiplies each of the data outputted from said data distributors by digital filter coefficients corresponding thereto, respectively.

5. A communication apparatus having a digital filter according to claim 4.

6. An X-time interpolation FIR type digital filter, the digital filter coefficients of which are configured to be even-ordered and even-symmetrical, and the interpolation ratio of which is x (x is an integral number of 4 or more), comprising:

a delay unit including delay elements of n stages (n is an even number of 2 or more), into which serial data are inputted;

n/2 data distributors in which the ratio of the number of inputs to that of outputs is 2:x;

a coefficient holding circuit for holding coefficients equivalent to half at one side in said even-ordered and even-symmetrical digital filter coefficients;

n*(x/2) multipliers which multiply each of the data outputted from said n/2 data distributors by digital filter coefficients corresponding thereto, respectively; and x/2 groups of adders which add to each other n pieces of data outputted in parallel at the same time among the data outputted by time-sharing from said n *(x/2) multipliers, and wherein two pieces of data outputted in parallel from a pair of delay elements located at symmetrical positions where the pair of delay elements overlap each other when a delay unit including said delay elements of n stages is folded over into half centering around the point of connection of the (n/2)th delay element and (n+1/2)th delay element, are inputted into each of said n/2 data distributors, and one piece of the data which is inputted into said data distributor is outputted by time-sharing one after another from the first output terminal toward the xth output terminal at a frequency which is x times the operating frequency of said delay unit, and the other inputted data is outputted one after another from the xth output terminal toward the first output terminal at a frequency which is x times the operating frequency of said delay unit.

7. An X-time interpolation FIR type digital filter, the digital filter coefficients of which are configured to be even-ordered and even-symmetrical, the number of taps of which is k (k is an even number) and the interpolation ratio of which is x (x is an integral number of 4 or more), comprising:

a multiplexing circuit for multiplexing the first and second series of data, which are inputted in parallel in synchronization with the first clock, alternately in synchronization with the second clock of the frequency which is higher by two times than that of said first clock;

a delay unit including delay elements of 2*(k/x) stages operating in synchronization with said second clock;

k/x data distributors into which two pieces of data outputted in parallel to each other from a pair of delay elements located at the symmetrical positions where the pair of delay elements overlap each other when said delay unit including said 2*(k/x) delay elements is folded over into half centering around the point of connection of the (n/2)th delay element and (n+1/2)th delay element, are inputted, and which distribute the respective inputted data to two output terminals by time-sharing at the frequency which is higher by two times than that of said second clock;

a coefficient holding circuit for holding only the coefficients equivalent to half at one side in said even-ordered and even-symmetrical digital filter coefficients;

2*(k/x) multipliers which multiply the respective data outputted from said output terminals of said data distributors by digital filter coefficients corresponding thereto, respectively; and a plurality of adders which perform additions with respect to the data outputted from the respective multipliers so that the independence of said first series and second series of data is maintained.

8. An x-time interpolation FIR type digital filter according to claim 7, wherein each of said data distributors has a first output terminal and a second output terminal, and repeats such time-sharing output where the other input data is outputted into the second output terminal when one input data is outputted to said first output terminal, and said other input data is outputted into said first output terminal when said one input data is outputted to said second output terminal.

9. An x-time interpolation FIR type digital filter according to claim 7, wherein said first series and second series data are data in which quadratureity can be established on a phase plane, and said plurality of adders perform additions of data outputted from said respective multipliers so that the quadratureity of the data of said respective series is maintained.

10. An x-time interpolation FIR type digital filter according to claim 9, wherein said first series and second series data are, respectively, data of quadrature components and data of the inphase components of QPSK (Quadrature Phase Shift Keying) modulated signals.

11. An x-time interpolation FIR type digital filter according to claim 7, further comprising:
a separating circuit for separating the first digital filter output signals for said first series of data from the second digital filter output signals for second series of data; and
a phase adjusting circuit for adjusting phases of said first digital filter output signals or said second digital filter output signals, which are separated from each other by said separating circuit, and for synchronizing the first and second digital filter output signals on the basis of the phases.

12. An x-time interpolation FIR type digital filter according to claim 11, further comprising:
a selector for selectively outputting either the first or second digital filter output signals, the phases of which are adjusted by passing through said phase adjusting circuit, or the first or second digital filter output signals which do not pass through the phase adjusting circuit.

13. An x-time interpolation FIR type digital filter according to claim 12, wherein said first and second digital filter output signals are, respectively, signals obtained by carrying out a digital filtering with respect to quadrature components and inphase components of QPSK (Quadrature Phase Shift Keying) modulated signals, and said first or second digital filter output which does not pass through said phase adjusting circuit is selected by said selector, and OQPSK (Offset Quadrature Phase Shift Keying) modulated signals are outputted from said FIR type digital filter.

14. A communication apparatus, comprising:
a digital filter according to claim 7, into which signals of the inphase components and quadrature components of digital modulated signals are inputted in parallel;
a digital-analog converter for converting each of the digital filter output signals for said inphase components and digital output signals for said quadrature components, which are outputted from the digital filter, to analog signals; and
a modulator for carrying out an predetermined modulation with respect to analog signals outputted from the respective digital-analog converters.

15. A communication apparatus having a digital filter according to claim 12.

16. An X-time interpolation FIR type digital filter, the digital filter coefficients of which are configured to be even-ordered and even-symmetrical, the number of taps of which is k (k is an even number) and the interpolation ratio of which is x (x is an integral number of 4 or more), comprising:
a multiplexing circuit for multiplexing the first series and second series of data, which are inputted in parallel to each other in synchronization with the first clock, alternately in synchronization with the second clock of a frequency higher by two times than that of said first clock;
a delay unit including 2*(k/x) delay elements operating in synchronization with said second clock;
k/x data distributors into which two pieces of data outputted in parallel to each other from a pair of delay elements located at the symmetrical positions where the pair of delay elements overlap each other when said delay unit is folded over into half centering around the point of connection of the n/2th delay element and (n+1/2)th delay element are inputted, and which distribute the respective inputted data to two output terminals by time-sharing at a frequency which is higher by two times than that of said second clock;
a first coefficient holding circuit for holding coefficients equivalent to half at one side, which are in the digital filter coefficients used for processing said first series of data, of said even-ordered and even-symmetrical digital filter coefficients;
a second coefficient holding circuit for holding coefficients equivalent to half at one side, which are in the digital filter coefficients used for processing said second series of data, of said even-ordered and even-symmetrical digital filter coefficients;
a digital filter coefficient selecting circuit for selectively outputting either one of the digital filter coefficients held by said first coefficient holding circuit and the digital filter coefficients held by said second coefficient holding circuit, in synchronization with a clock of a frequency higher by two times than that of said second clock;
2*(k/x) multipliers for multiplexing the respective data outputted from said output terminals of said data distributors by digital filter coefficients; and
a plurality of adders for performing additions so that the independence of said first series and second series of data is maintained with respect to the data outputted from the respective multipliers.

17. An x-time interpolation FIR type digital filter according to claim 16, wherein said digital filter coefficients held by said first coefficient holding circuit and second coefficient holding circuits are rewritable.

18. An x-time interpolation FIR type digital filter according to claim 17, further comprising:
a coefficient calculating circuit for calculating digital filter coefficients corresponding to input conditions; and
a coefficient writing circuit for writing the digital filter coefficients calculated by said coefficient calculating circuit into said first and second coefficient holding circuits.

19. A communication apparatus, comprising:
a digital filter according to claim 17, into which signals of the inphase components and those of quadrature components of digital converted signals are inputted in parallel;
a digital-analog converter for converting each of the digital filter output signals for said inphase components and digital output signals for said quadrature components, which are outputted from the digital filter, to analog signals;
an orthogonal modulator for carrying out an orthogonal modulation with respect to each of the analog signals outputted from the respective digital-analog converters;
a gain difference detector for detecting the respective gain differences of orthogonally modulated signals;
a coefficient calculation circuit for calculating digital filter coefficients so that said gain differences are made to become zero; and
a coefficient writing circuit for writing calculated digital filter coefficients into said first and second coefficient holding circuits of said digital filter.

20. An X-time interpolation FIR type digital filter, the digital filter coefficients of which is configured to be even-ordered and even-symmetrical, the number of taps of which is k (k is an even number) and the interpolation ratio of which is x (x is an integral number of 4 or more), comprising:
a multiplexing circuit for multiplexing the first series and second series of data, which are inputted in parallel to each other in synchronization with the first clock, alternately in synchronization with the second clock of a frequency higher by two times than that of said first clock;

a delay unit of 2*(k/x) stages operating in synchronization with said second clock;

k/x data distributors, into which two pieces of data outputted in parallel to each other from a pair of delay elements located at the symmetrical positions where the pair of delay elements overlap each other when said delay unit is folded over into half centering around the point of connection of the (n/2)th delay element and (n+1/2)th delay element, are inputted, and which distribute the respective inputted data to two output terminals by time-sharing at a frequency which is higher by two times than that of said second clock;

a coefficient holding circuit for holding coefficients equivalent to half at one side in said even-ordered and even-symmetrical digital filter coefficients;

2*(k/x) multipliers which multiply each of the data outputted from said output terminals of said data distributors by digital filter coefficients corresponding thereto, respectively;

a plurality of adders which perform additions with respect to the data outputted from the respective multipliers so that the independence of said first series and second series of data is maintained; and a frequency-variable clock generator being a clock generator for generating said first clock or said second clock, which is able to vary the frequency of clocks generated.

21. An x-time interpolation FIR type digital filter according to claim 20, further comprising:

a timing adjustment circuit for adjusting the send-out timing of the final digital filter output signal.

22. A communication apparatus having a digital filter according to claim 20.

23. A communication apparatus, comprising:

a digital filter according to claim 20, into which signals of the inphase components and quadrature components of digital modulated signals are inputted in parallel;

a digital-analog converter for converting each of the digital filter output signals for said inphase components and digital output signals for said quadrature components, which are outputted from the digital filter, to analog signals; and a modulator for carrying out an predetermined modulation with respect to analog signals outputted from the respective digital-analog converters.

24. A digital signal processing method, for achieving a digital signal process substantially expressed by a transmission function H(z) of the following expression (1), in which a FIR type digital filter configured so as to have an even-ordered and even-symmetrical tap construction is used, by performing a digital signal process expressed by the respective transmission functions H(z) of the following expressions (2), (3), (4), and (5) by time-sharing;

Expression (1)

$H(z)=h1+h2z-1+h3z-2+h4z-3+h5z-4+h6z-5+h7z-6+h8z-7+h9z-8+h10z-9+h11z-10+h12z-11+h13z-12+h14z-13+h15z-14+h16z-15+h17z-16+h18z-17+h19z-18+h20z-19+h21z-20+h22z-21+h23z-22+h24z-23+h25z-24+h26z-25+h27z-26+h28z-27+h29z-28+h30z-29+h31z-30+h32z-31$

Expression (2)

$H(z)=h1+h5z-4+h9z-8+h13z-12+h17z-16+h21z-20+h25z-24+h29z-28$

Expression (3)

$H(z)=h2z-1+h6z-5+h10z-9+h14z-13+h18z-17+h22z-21+h26z-25+h30z-29$

Expression (4)

$H(z)=h3z-2+h7z-6+h11z-10+h15z-14+h19z-18+h23z-22+h27z-26+h31z-30$

Expression (5)

$H(z)=h4z-3+h8z-7+h12z-11+h16z-15+h20z-19+h24z-23+h28z-27+h32z-31$ where, in expressions (1), (2), (3), (4), and (5), h1 through h32 mean, respectively, digital filter coefficients, z-1 through z-31 mean the first-ordered delay through the thirty-first-ordered delay.

25. A digital signal processing method, for achieving a digital signal process substantially expressed by a transmission function H(z) of the following expression (1), in which a FIR type digital filter configured so as to have an even-ordered and even-symmetrical tap construction is used, by performing a digital signal process expressed by the respective transmission functions H(z) of the following expressions (6), (7), (8), and (9) by time-sharing;

Expression (1)

$H(z)=h1+h2z-1+h3z-2+h4z-3+h5z-4+h6z-5+h7z-6+h8z-7+h9z-8+h10z-9+h11z-10+h12z-11+h13z-12+h14z-13+h15z-14+h16z-15+h17z-16+h18z-17+h19z-18+h20z-19+h21z-20+h22z-21+h23z-22+h24z-23+h25z-24+h26z-25+h27z-26+h28z-27+h29z-28+h30z-29+h31z-30+h32z-31$

Expression (6)

$H(z)=h1+h5z-4+h9z-8+h13z-12+h16z-16+h12z-20+h8z-24+h4z-28$

Expression (7)

$H(z)=h2z-1+h6z-5+h10z-9+h14z-13+h15z-17+h11z-21+h7z-25+h3z-29$

Expression (8)

$H(z)=h3z-2+h7z-6+h11z-10+h15z-14+h14z-18+h10z-22+h6z-26+h2z-30$

Expression (9)

$H(z)=h4z-3+h8z-7+h12z-11+h16z-15+h13z-19+h9z-23+h5z-27+h1z-31$ where, in expression (1) and expressions (6), (7), (8), and (9), h1 through h32 mean digital filter coefficients, z-1 through z-31 mean the first-ordered delay through the thirty-first-ordered delay.

26. A digital signal processing method, for performing a digital signal process substantially expressed by a transmission function Hi(z) of the following expression (11), in which a FIR type digital filter configured so as to have an even-ordered and even-symmetrical tap construction is used, and a digital signal process substantially expressed by a transmission function Hq(z) of the following expression (12), in which a FIR type digital filter configured so as to have an even-ordered and even-symmetrical tap construction is used, respectively in parallel to each other, comprising the steps of:

performing the respective digital signal processes, which are expressed by the respective transmission functions H(z) of expressions (13) and (14) shown in the following State 1, in parallel to each other;

performing the respective digital signal processes, which are expressed by the respective transmission functions H(z) of expressions (15) and (16) shown in the following State 2, in parallel to each other;

performing the respective digital signal processes, which are expressed by the respective transmission functions H(z) of expressions (17) and (18) shown in the following State 3, in parallel to each other; and performing the respective digital signal processes, which are expressed by the respective transmission functions H(z) of expressions (19) and (20) shown in the following State 4, in parallel to each other.

Expression (11)

$Hi(z)=h1+h2zi-1+h3zi-2+h4zi-3+h5zi-4+h6zi-5+h7zi-6+h8zi-7+h9zi-8+h10zi-9+h11zi10+h12zi-11+h13zi-12+h14zi-13+h15zi-14+h16zi-15+h17zi-16+h18zi-17+h19zi-18+h20zi-19+h21zi-20+h22zi-21+h23zi-22+h24zi-23+h25zi-24+h26zi-25+h27zi-26+h28zi-27+h29zi-28+h30zi-29+h31zi-30+h32zi-31$

Expression (12)

$Hq(z)=h1+h2zq-1+h3zq-2+h4zq-3+h5zq-4+h6zq-5+h7zq-6+h8zq-7+h9zq-8+h10zq-9+h11zq-10+h12zq-11+h13zq-12+h14zq-13+h15zq-14+h16zq-15+h17zq-16+h18zq-17+h19zq-18+h20zq-19+h21zq-20+h22zq-21+h23zq-22+h24zq-23+h25zq-24+h26zq-25+h27zq-26+h28zq-27+h29zq-28+h30zq-29+h31zq-30+h32zq-31$ (State 1)

$Hi(z)=h1+h5zi-4+h9zi-8+h13zi-12+h16zi-16+h12zi-20+h8zi-24+h4zi-28$ (13)

$Hq(z)=h3zq-2+h7zq-6+h11zq-10+h15zq-14+h14zq-18+h10zq-22+h6zq-26+h2zq-30$ (14)

(State 2)

$Hi(z)=h2zi-1+h6zi-5+h10zi-9+h14zi-13+h15zi-17+h11zi-21+h7zi-25+h3zi-29$ (15)

$Hq(z)=h4zq-3+h8zq-7+h12zq-11+h16zq-15+h13zq-19+h9zq-23+h5zq-27+h1zq-31$ (16)

(State 3)

$Hi(z)=h3zi-2+h7zi-6+h11zi-10+h15zi-14+h14zi-18+h10zi-22+h6zi-26+h2zi-30$ (17)

$Hq(z)=h1+h5zq-4+h9zq-8+h13zq-12+h16zq-16+h12zq-20+h8zq-24+h4zq-28$ (18)

(State 4)

$Hi(z)=h4zi-3+h8zi-7+h12zi-11+h16zi-15+h13zi-19+h9zi-23+h5zi-27+h1zi-31$ (19)

$Hq(z)=h2zq-1+h6zq-5+h10zq-9+h14zq-13+h15zq-17+h11zq-21+h7zq-25+h3zq-29$ (20)

where, in expressions (11) through (20), h1 through h32 mean digital filter coefficients, and z-1 through z-31 mean the first-ordered delay through the thirty-first-ordred delay.

* * * * *